US005519237A

United States Patent [19]

Itoh et al.

[11] Patent Number: 5,519,237

[45] Date of Patent: May 21, 1996

[54] SEMICONDUCTOR MEMORY DEVICE

[75] Inventors: Hiromi Itoh; Tomonori Okudaira; Keiichiro Kashihara, all of Hyogo, Japan

[73] Assignee: Mitsubishi Denki Kabushiki Kaisha, Tokyo, Japan

[21] Appl. No.: 264,117

[22] Filed: Jun. 22, 1994

[30] Foreign Application Priority Data

Nov. 12, 1993 [JP] Japan .................................... 5-283672

[51] Int. Cl.$^{6}$ .................................................... H01L 29/68

[52] U.S. Cl. .......................... 257/306; 257/308; 365/149

[58] Field of Search .................................... 365/149, 182; 257/277, 324, 303, 306, 307, 308

[56] References Cited

U.S. PATENT DOCUMENTS 5,323,343 6/1994 Ogoh et al. ............................. 257/306

*Primary Examiner*—David C. Nelms

*Assistant Examiner*—Vũ Lê

*Attorney, Agent, or Firm*—Lowe, Price, LeBlanc & Becker

[57] ABSTRACT

A first interlayer insulating film having a second contact hole is formed on a main surface of a semiconductor substrate 1 in a peripheral circuitry. A second plug electrode of the same material as a first plug electrode in a memory cell array is formed in the second contact hole. A pad layer is formed over the second plug electrode and a top surface of the first interlayer insulating film. The pad layer and a capacitor lower electrode are made of the same material. The pad layer is covered with the second interlayer insulating film. A third contact hole is formed at a portion of the second interlayer insulating film located above the pad layer. A first aluminum interconnection layer is formed in the third contact hole. Thereby, a contact can be formed easily between the interconnection layer and the main surface of the semiconductor substrate in the peripheral circuitry of a DRAM, and a manufacturing process can be simplified.

10 Claims, 37 Drawing Sheets

<MEMORY CELL ARRAY>

<PERIPHERAL CIRCUIT>

<MEMORY CELL ARRAY>

<PERIPHERAL CIRCUIT>

<MEMORY CELL ARRAY>
<PERIPHERAL CIRCUIT>
W2
D4

<MEMORY CELL ARRAY>
<PERIPHERAL CIRCUIT>

<MEMORY CELL ARRAY>
<PERIPHERAL CIRCUIT>

<MEMORY CELL ARRAY>

<PERIPHERAL CIRCUIT>

14a
15a
15a
15a
1
2
3g
5
6c
8
9a
3f
2
3e
<PERIPHERAL CIRCUIT>

15
15
15
1
3d
9
7d
14
2
7c
9
3c
4b
6b
7b
9
12
10
3b
4a
6a
9
7a
3a
<MEMORY CELL ARRAY>

28a
26a
27a
16a
15a
14a
16a
15a
2
3e
16a
15a
2
1
3g
5
6c
8
9a
3f
<PERIPHERAL CIRCUIT>

28
26
27
16
15
16
15
16
15
1
3d
9
7d
14
2
7c
9
3c
4b
6b
7b
12
9
10
3b
4a
6a
9
7a
3a
<MEMORY CELL ARRAY>

<MEMORY CELL ARRAY>
<PERIPHERAL CIRCUIT>

<PERIPHERAL CIRCUIT>

<MEMORY CELL ARRAY>

<PERIPHERAL CIRCUIT>

<MEMORY CELL ARRAY>

<PERIPHERAL CIRCUIT>

<MEMORY CELL ARRAY>

<MEMORY CELL ARRAY>
<PERIPHERAL CIRCUIT>
1
2
3a
3b
3c
3d
3e
3f
3g
4a
4b
5
6a
6b
6c
7a
7b
7c
7d
8
9
9a
10
12
14
14a
15
15a
15b
17b
17c
18a
19a
20
20a
26
27
28
26a
27a
28a

<MEMORY CELL ARRAY>

<PERIPHERAL CIRCUIT>

<MEMORY CELL ARRAY>

<PERIPHERAL CIRCUIT>

<PERIPHERAL CIRCUIT>

<MEMORY CELL ARRAY>

<MEMORY CELL ARRAY>

<PERIPHERAL CIRCUIT>

SEMICONDUCTOR MEMORY DEVICE

BACKGROUND OF THE INVENTION

1. Field of the Invention

The present invention relates to a semiconductor memory device and a method of manufacturing the same, and in particular to a structure of a DRAM (dynamic random access memory) and a method of manufacturing the same.

2. Description of the Related Art

A demand for semiconductor memory devices is rapidly increasing owing to wide use of information equipment such as computers. From a functional standpoint, devices having a large scale storage capacity and capable of operating at a high speed are in great demand. Correspondingly, technology has been developed for improving the degree of integration, speed and reliability of the semiconductor memory device.

DRAMs (Dynamic Random Access Memories) are well known as semiconductor memory devices which allow random input and output of storage information. In general, the DRAM is formed of a memory cell array which is a storage region storing a large number of storage information and a peripheral circuitry for controlling an operation of the memory cell array.

FIG. 28 is a block diagram showing structures of a conventional DRAM. Referring to FIG. 28, a DRAM 150 includes memory cell array 151 for storing data signals of storage information, row and column address buffer 152 for externally receiving an address signal which is used for selecting a memory cell forming a unit storage circuit, row and column decoders 153 and 154 for decoding the address signal and thereby designating a memory cell, sense refresh amplifier 155 for amplifying and reading a signal stored in the designated memory cell, data-in and data-out buffers 156 and 157 for input and output of data, and clock generator 158 for generating a clock signal.

The memory cell array 151 which occupies a large area on the semiconductor chip is formed of a plurality of memory cells which are arranged in a matrix form and each are adapted to store the unit storage information. Each memory cell is formed of one MOS (Metal Oxide Semiconductor) transistor and one capacitor connected thereto. The memory of the above structure is called a memory cell of one-transistor/one-capacitor type. Since the memory cell of this type has a simple structure, degree of integration of the memory cell array can be easily increased. By this reason, they are widely used in DRAMs of a large capacity.

The memory cells of the DRAMs are classified into several types in accordance with structures of capacitors. In a stacked type capacitor memory cell, a major portion of the capacitor is extended up to positions above a gate electrode and a field isolating film for increasing an area of opposed portions of electrodes in the capacitor.

This can increase a capacitor capacitance. The stacked type capacitor having the above feature can ensure a sufficient capacitor capacitance even if elements are miniaturized in accordance with high integration of the semiconductor device. Consequently, the stacked type capacitors have been widely used in accordance with high integration of the semiconductor memory devices.

However, it is difficult to ensure an intended capacitor capacitance in the stacked type capacitor described above, if elements are further miniaturized for forming a DRAM, e.g., of 256 Mbits.

In order to increase the capacitor capacitance, it has been attempted to use a high dielectric film such as PZT (lead zirconate titanate ceramics). FIGS. 29A and 29B show an example of a DRAM in which the high dielectric film such as PZT is used as the dielectric film of capacitor.

Referring to FIGS. 29A and 29B, the DRAM includes a memory cell array and a peripheral circuitry as described above. A structure of the memory cell array of the conventional DRAM will now be described below. In the memory cell array, a p-type semiconductor substrate 201 is provided at its main surface with an element isolating region, at which a field oxide film 202 is formed. Semiconductor substrate 201 is also provided at its main surface with an element forming region, at which transfer gate transistors **204*a* and 204*b*** are formed.

Transfer gate transistor **204*a* includes n-type impurity regions 203*a* and 203*b*, which are formed at the main surface of semiconductor substrate 201 with a space between each other for forming source/drain regions, and a gate electrode (word line) 207*a* formed on a channel region between impurity regions 203*a* and 203*b* with a gate insulating film 206*a*** therebetween.

Transfer gate transistor **204*b* includes n-type impurity regions 203*b* and 203*c* forming source/drain regions, and a gate electrode 207*b* formed on a channel region between impurity regions 203*b* and 203*c* with a gate insulating film 206*b*** therebetween.

Gate electrodes **207*c* and 207*d* of another transfer gate transistor are extended over field oxide film 202. Gate electrodes 207*a*, 207*b*, 207*c* and 207*d* are covered with oxide films 209. A buried bit line 210 is formed on impurity region 203*b* and is electrically connected thereto. Buried bit line 210 is covered with an insulating layer 212**.

Insulating layer 212 and oxide films 209 are covered with a first interlayer insulating film 214 having a flattened top surface. First interlayer insulating film 214 is provided with first contact holes 215 located above impurity regions **203*a*, 203*c* and 203*d*.**

In contact holes 215 are formed first plug electrodes 216 electrically connected to impurity regions **203*a*, 203*c* and 203*d*, respectively. Capacitor lower electrodes 217 are formed on first plug electrodes 216 with barrier layers 229 interposed therebetween and are electrically connected thereto. Capacitor lower electrodes 217 may be formed of platinum (Pt). Barrier layers 229 prevent diffusion between the material of capacitor lower electrode 217 and the material of first plug electrode 216**.

Capacitor lower electrodes 217 are covered with a capacitor dielectric film 218, which is formed of high dielectric material such as $SrTiO_3$. Capacitor dielectric film 218 is covered with a capacitor upper electrode 219, which is formed of material such as platinum (Pt).

Capacitor upper electrode 219 is covered with a second interlayer insulating film 220 having a flattened top surface. A distance D between the top surface of second interlayer insulating film 220 and the main surface of semiconductor substrate 201 is about 1.7 μm.

First aluminum interconnection layers 221 are formed on second interlayer insulating film 220 with a space between each other. First aluminum interconnection layers 221 are covered with a protective film 222, on which second aluminum interconnection layer 223 is formed. Capacitor lower electrodes 217, capacitor dielectric film 218 and capacitor upper electrode 219 form a capacitor 224.

Now, a structure of the peripheral circuitry of the conventional DRAM will be described below. In the peripheral circuitry shown in FIG. 29B, field oxide films 202 which are spaced from each other are formed at the element isolating regions in the main surface of p-type semiconductor substrate 201. AMOS transistor 205 is formed at the element forming region in the main surface of semiconductor substrate 210.

MOS transistor 205 includes n-type impurity regions 203*f* and 203*g* forming source/drain regions, and a gate electrode 208 formed on a channel region between impurity regions 203*f* and 203*g* with a gate insulating film 206*c* therebetween. An impurity region 203*e* of another transistor is formed at the element forming region in the main surface of semiconductor substrate 201.

A polysilicon pad 211*a* is formed on impurity region 203*f* and is electrically connected thereto. A polysilicon pad 211*b* is formed on impurity region 203*g* and is electrically connected thereto. Polysilicon pad 211*a* is covered with an insulating layer 213. Gate electrode 208 is covered with an oxide film 209*a*.

A first interlayer insulating film 214*a* is formed over the main surface of semiconductor substrate 201. A second interlayer insulating film 220*a* is formed on first interlayer insulating film 214*a*. Second interlayer insulating film 220*a* is formed at the peripheral circuitry when second interlayer insulating film 220 is formed at the memory cell array. Second interlayer insulating film 220*a* contributes to ensure insulation between first aluminum interconnection layers 221*a*, which will be described later, and conductive layers formed on semiconductor substrate 210. However, even if second interlayer insulating film 220*a* were eliminated, insulation between first aluminum interconnection layer 221*a* and the conductive layers on semiconductor substrate 210 would be ensured by first interlayer insulating film 214*a*.

There are formed second contact holes 215*a* penetrating first and second interlayer insulating films 214*a* and 220*a*. A depth D2 of second contact holes 215*a* varies depending on a position of them, and is in a range from about 0.8 μm to about 2.0 μm. The depth specifically varies in accordance with variation of film thicknesses of first and second interlayer insulating films 214*a* and 220*a* due to irregular or stepped shape of the bases of them.

Second plug electrodes 216*a* made of, e.g., polysilicon are formed in second contact holes 215*a*. First aluminum interconnection layers 221*a* are formed on second plug electrodes 216*a*. First aluminum interconnection layers 221*a* are covered with a protection layer 222*a*, on which second aluminum interconnection layer 223*a* is formed.

A method manufacturing the conventional DRAM having the above structure will be described below. FIGS. 30A and 30B to 36A and 36B are fragmentary cross sections showing 1st to 7th steps in the process of manufacturing the conventional DRAM.

Referring first to FIGS. 30A and 30B, field oxide films 202 are formed at the element isolating regions on the main surface of semiconductor substrate 201, e.g., by a LOCOS (Local Oxidation Of Silicon) method. Then, gate insulating films 206*a*, 206*b* and 206*c* are formed, e.g., by a thermal oxidation method. In the memory cell array, gate electrodes (word lines) 207*a*, 207*b*, 207*c* and 207*d* are selectively formed on gate insulating films 206*a* and 206*b* as well as field oxide films 202. At the same time, gate electrode 208 is formed on gate insulating film 206*c* in the peripheral circuitry.

Then, impurity is implanted into the main surface of semiconductor substrate 201 using gate electrodes 207*a*, 207*b* and 208 and field oxide films 202 as a mask. Thereby, impurity regions 203*a*, 203*b*, 203*c* and 203*d* are formed in the memory cell array, and impurity regions 203*e*, 203*f* and 203*g* are formed in the peripheral circuitry.

Then, oxide films 209 and 209*a* are formed over gate electrodes 207*a*, 207*b*, 207*c* and 208. A polysilicon layer is formed over the whole main surface of semiconductor substrate 201, and then is patterned into a predetermined configuration. Thereby, buried bit line 210, which is electrically connected to impurity region 203*b*, is formed on impurity region 203*b* in the memory cell array. At the same time, polysilicon pad 211*a* electrically connected to impurity region 203*f* is formed on impurity region 203*f* in the peripheral circuitry.

Insulating layers 212 and 213 are formed to cover buried bit line 210 and polysilicon pad 211*a*. Then, a polysilicon layer is deposited over the whole main surface of semiconductor substrate 201. This polysilicon layer is patterned to form polysilicon pad 211*b* on impurity region 203*g* electrical connected thereto.

Then, a CVD method or the like is used to form first interlayer insulating films 214 and 214*a* made of, e.g., BPSG (Boro-Phospho Silicate Glass) on the whole main surface of semiconductor substrate 201. Flattening processing is effected on first interlayer insulating films 214 and 214*a*.

Referring to FIGS. 31A and 31B, first contact holes 215 reaching the surfaces of impurity regions 203*a*, 203*c* and 203*d* are formed at first interlayer insulating film 214 in the memory cell array. A polysilicon layer (not shown) filling first contact holes 215 is formed over first interlayer insulating film 214 to fill first contact holes 215. Etchback is effected on the polysilicon layer to form first plug electrodes 216 made of polysilicon in first contact holes 215.

Referring to FIGS. 32A and 32B, barrier layers 229 made of TiN and capacitor lower electrodes 217 made of, e.g., platinum (Pt) are formed on plugs 216 by a sputtering method or the like. Capacitor dielectric film 218 made of high dielectric material is formed to cover capacitor lower electrode 217 by a sputtering method or the like.

Capacitor dielectric film 218 may be made of tantalum oxide ($TaO_2$), lead zirconate titanate (PZT), lead lanthanum zirconate titanate (PLZT), strontium titanate (STO) or barium titanate (BTO).

Capacitor upper electrode 219 made of, e.g., platinum (Pt) is formed on capacitor dielectric film 218 by a sputtering method or the like. Thereby, capacitors 224 each including capacitor lower electrode 217, capacitor dielectric film 218 and capacitor upper electrode 219 are formed on first interlayer insulating film 214.

Referring to FIGS. 33A and 33B, second interlayer insulating film 220 made of, e.g., a BPSG film is formed on capacitor upper electrode 219 in the memory cell array by a CVD method or the like. At the same time, second interlayer insulating film 220*a* is formed on first interlayer insulating film 214 in the peripheral circuitry. Flattening processing is effected on second interlayer insulating films 220 and 220*a*.

Referring to FIGS. 34A and 34B, second contact holes 215*a* penetrating first and second interlayer insulating films 214*a* and 220*a* are formed in the peripheral circuitry. Depth D2 of second contact holes 215 thus formed in the peripheral circuitry varies within a large range from about 0.8 μm to about 2.0 μm.

Second contact holes 215*a* have depth D2 of various values due to the fact that film thicknesses of first and second interlayer insulating films 214*a* and 220*a* varies depending on their position on semiconductor substrate 201 due to irregular or stepped shaped of their bases.

Referring now to FIGS. 35A and 35B, second plug electrodes 216*a* made of, e.g., polysilicon are formed in second contact holes 215*a* formed in the peripheral circuitry. Second plug electrodes 216*a* are required due to the fact that second contact holes 215*a* have the depth of various values from about 0.8 μm to about 2.0 μm as described above.

Referring to FIGS. 36A and 36B, first aluminum interconnection layers 221 which are spaced from each other are formed on second interlayer insulating film 220 in the memory cell array by a sputtering method or the like. At the same time, first aluminum interconnection layers 221*a* are formed on the top surfaces of second plug electrodes 216*a* in the peripheral circuitry.

Thereafter, protective films 222 and 222*a* are formed to cover first aluminum interconnection layers 221 and 221*a*, and second aluminum interconnection layers 223 and 223*a* are formed over protective films 222 and 222*a*, respectively. Through the steps described above, the conventional DRAM shown in FIGS. 29A and 29B is completed.

The conventional DRAM described above, however, has problems which will be described below with reference to FIGS. 37 and 38. FIG. 37 shows a first problem of the conventional DRAM, and is a fragmentary cross section of the peripheral circuitry at a 5th step in the process of manufacturing the conventional DRAM. FIG. 38 shows a third problem of the conventional DRAM, and is a fragmentary cross section of the peripheral circuitry at a 7th step in the process of manufacturing the conventional DRAM.

The first problem of the conventional DRAM will now be described below with reference to FIG. 37. As shown in FIG. 37, depth D2 of second contact holes 215*a* formed at the peripheral circuitry in the conventional DRAM varies within a range from a small value less than about 1 μm to large values of about 1.8 μm to about 2.0 μm. Thus, depth D2 of second contact holes 215*a* varies to a relatively large extent.

Meanwhile, second contact holes 215*a* generally have an open width W of a substantially constant value from about 0.6 μm to about 0.8 μm. Therefore, the aspect ratio of second contact holes 215*a* varies within a range from a small value of about 1 to a large value from 2 to 3 or more. Thus, the aspect ratio varies to a relatively large extent.

In accordance with higher integration, however, open width W of second contact holes 215*a* is reduced. This further increases the value of aspect ratio of contact holes 215*a*. In other words, in accordance with higher integration, the value of aspect ration further increases. As a result, higher integration makes it extremely difficult to form second contact holes 215*a* in the peripheral circuitry.

Now, a second problem of the conventional DRAM will be described below. This problem is caused by the above increase of aspect ration of second contact holes 215*a* in accordance with higher integration.

The increase of aspect ratio of second contact holes 215*a* in accordance with the integration causes the following necessity. Second contact holes 215*a* must be filled, e.g., with second plug electrodes 216*a* so as to make contact between first aluminum interconnection layers 221*a* and impurity regions 203*e*, 203*f* and 203*g*.

More specifically, extra steps must be employed for forming second plug electrodes 216*a* within second contact holes 215*a* so as to make contact between first aluminum interconnection layer 221*a* and impurity regions 203*e*, 203*f* and 203*g* in the peripheral circuitry. This increases a manufacturing cost and complicates the manufacturing process.

The third problem of the conventional DRAM will be described below with reference to FIG. 38. As already described, open width W of second contact holes 215*a* in the peripheral circuitry decreases in accordance with higher integration as shown in FIG. 38. A plan width W1 of first aluminum interconnection layers 221*a* formed on second contact holes 215*a* also decreases.

This reduces a maximum allowable magnitude of dislocation of the mask used for patterning first aluminum interconnection layers 221*a*. As a result, the structure of conventional DRAM causes the problem that formation of first aluminum interconnection layers 221*a* becomes difficult in accordance with higher integration.

SUMMARY OF THE INVENTION

The present invention has been developed in view of the above matters. An object of the invention is to provide a semiconductor memory device having a structure in which contact holes can be formed easily in a peripheral circuitry, and a method of manufacturing the same.

Another object of the invention is to provide a semiconductor memory device having a structure allowing reduction of a manufacturing cost, and a method of manufacturing the same.

Still another object of the invention is to provide a semiconductor memory device having a structure which facilitates formation of a contact between a first aluminum interconnection layer in a peripheral circuitry and an impurity region at a main surface of a semiconductor substrate without increasing a manufacturing cost, and a method of manufacturing the same.

A semiconductor memory device according to the invention generally includes a structure in which a memory cell array (memory cell portion) including memory cells storing information and a peripheral circuitry (peripheral circuit portion) including peripheral circuits controlling an operation of the memory cells are formed on a main surface of a semiconductor substrate.

The semiconductor memory device according to the invention includes a first interlayer insulating film which is provided with a first opening at a predetermined position on the main surface of the semiconductor substrate in the memory cell array and a second opening at a predetermined position on the main surface of the semiconductor substrate in the peripheral circuitry, first and second plug electrodes formed in the first and second openings, respectively, and are electrically connected to the main surface of the semiconductor substrate, a capacitor lower electrode formed on and electrically connected to the first plug electrode, a capacitor dielectric film covering the capacitor lower electrode, a capacitor upper electrode covering the capacitor dielectric film, a pad layer formed over a top surface of the second plug electrode and a top surface of the first interlayer insulating film and electrically connected to the second plug electrode, a second interlayer insulating film formed over the pad layer and having a third opening located above the pad layer, and an interconnection layer formed at least in the third opening and electrically connected to the pad layer.

The pad layer and the capacitor lower electrode are preferably made of the same material. The capacitor lower electrode and the first plug electrode are preferably integral with each other, and the pad layer and the second plug electrode are preferably integral with each other. The pad layer and the capacitor lower electrode are preferably made of noble metal having a high melting point.

According to the semiconductor memory device of the above aspect of the invention, a contact which electrically connects the interconnection layer formed in the peripheral circuitry to the main surface of the semiconductor substrate is formed of the third opening formed at the second interlayer insulating film, the interconnection layer formed in the third opening, the pad layer, the second opening formed at the first interlayer insulating film, and the second plug electrode formed in the second opening.

The pad layer is formed on the second plug electrode. The pad layer is preferably formed over the second plug electrode and the top surface of the first interlayer insulating film. This ensures a large area of the top surface of the pad layer. The large area of the top surface of the pad layer increases a degree of freedom relating to a position of the third opening. This facilitates formation of the third opening.

The second opening is formed at the first interlayer insulating film. The third opening is formed at the second interlayer insulating film. Thereby, the second and third openings have depths smaller than those of openings (contact holes) formed in the conventional peripheral circuitry. Therefore, aspect ratios of the second and third openings can be smaller than those of the openings formed in the conventional peripheral circuitry.

Consequently, the second and third openings can be formed more easily than the openings in the conventional peripheral circuitry. Owing to the above matters, the contacts between the insulating layers and the semiconductor substrate can be formed more easily than the prior art.

Since the degree of freedom relating to the position of the third opening increases, the third opening can be formed at a position shifted from a position of the second opening. Thereby, a large region can be ensured for forming the interconnection layers even if the degree of integration increases. As a result, the interconnection layers can be formed relatively easily even if the degree of integration increases.

If the pad layer and capacitor lower electrode are made of the same material, the pad layer and capacitor lower electrode can be formed at the same step(s). This simplifies the manufacturing process. If the first plug electrode and capacitor lower electrode are formed integrally with each other, and the second plug electrode and pad layer are formed integrally with each other, the first plug electrode and capacitor lower electrode can be formed at the same step(s), and the second plug electrode and pad layer can be formed at the same step(s). Therefore, the manufacturing process is simplified.

The pad layer may be made of platinum (Pt), in which case following operation and effect are obtained. The platinum forms a base of the third opening. In connection with the step of forming the third opening, the platinum has a good resistance against over-etching. Therefore, the third opening can be formed easily. The platinum is stable material and hence is resistive to oxidation. Therefore, good contact can be made between the interconnection layer and pad layer.

According to a method of manufacturing a semiconductor memory device of an aspect of the invention, a first interlayer insulating film is formed to cover a memory cell portion and a peripheral circuit portion, a first opening is formed to expose a part of the memory cell portion, and a second opening is formed to expose a part of the peripheral circuit portion. First and second plug electrodes which are electrically connected to a part of the memory cell portion and a part of the peripheral circuit portion in the first and second openings, respectively. A conductive layer is formed to cover top surfaces of the first and second plug electrodes and a top surface of the first interlayer insulating film. The conductive layer is patterned to form a capacitor lower electrode on the top surface of the first plug electrode, and a pad layer is formed on the top surface of the second plug electrode. A capacitor dielectric film and a capacitor upper electrode are sequentially formed to cover the capacitor lower electrode. A second interlayer insulating film is formed to cover the pad layer and the capacitor upper electrode. A third opening located above the pad layer is formed at the second interlayer insulating film. An interconnection layer electrically connected to the pad layer is formed at least in the third opening.

According to the method of manufacturing the semiconductor memory device of the above aspect of the invention, the second plug electrode of the peripheral circuitry is formed at the same step as that of forming the first plug electrode for connecting the capacitor lower electrode to the semiconductor substrate in the memory cell array (memory cell portion). The pad layer in the peripheral circuitry (peripheral circuit portion) is formed at the same step as that of forming the capacitor lower electrode in the memory cell array. Therefore, the second plug electrode and pad layer are formed in the peripheral circuitry without requiring any additional step.

The third opening covering the pad layer is formed at the second interlayer insulating film. Therefore, the third opening is shallower than an opening formed in the conventional peripheral circuitry. The third opening is required only to be located on the pad layer, so that the top surface of the pad layer can have a large area, whereby the degree of freedom relating to a position of the third opening can be relatively large. Thereby, the third opening can be formed easily.

The interconnection layer is formed in the third opening. In this manner, the contact is formed to make electrical connection between the interconnection layer in the peripheral circuitry and the main surface of the semiconductor substrate, so that it is possible to eliminate a step exclusively used for forming the plug electrode making electrical connection between the interconnection layer in the peripheral circuitry and the main surface of the semiconductor substrate. Therefore, the manufacturing process can be simpler than the prior art, and the manufacturing cost can be low.

A method of manufacturing a semiconductor memory device of another aspect of the invention, a first interlayer insulating film is formed to cover a memory cell portion and a peripheral circuit portion, a first opening is formed to expose a part of the memory cell portion and a second opening is formed to expose a part of the peripheral circuit portion. A conductive layer which fills the first and second openings is formed over a top surface of the first interlayer insulating film. The conductive layer is patterned to form a capacitor lower electrode covering the first opening and electrically connected to a part of the memory cell portion, and a pad layer covering the second opening and electrically connected to a part of the peripheral circuit portion. A capacitor dielectric film and a capacitor upper electrode are sequentially formed over the capacitor lower electrode. A second interlayer insulating film is formed over the pad layer and the capacitor upper electrode. A third opening is formed at the second interlayer insulating film located above the pad layer. An interconnection layer electrically connected to the pad layer is formed at least in the third opening.

According to the method of manufacturing the semiconductor memory device of the above aspect, the capacitor lower electrode is partially configured to having a function as the first plug electrode, and the pad layer is partially configured to have a function as the second plug electrode. Thus, the capacitor lower electrode and first plug electrode are integral with each other, and the pad layer and second plug electrode are integral with each other.

Thereby, the capacitor lower electrode and first plug electrode can be formed at the same step, and the pad layer and second plug electrode can be formed at the same step. Therefore, the manufacturing process can be further simplified compared with the above case.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B–9A and 9B are fragmentary cross sections showing 1st to 8th steps in a process of manufacturing the DRAM of the first embodiment of the invention, respectively;

FIGS. 11A and 11B–12A and 12B are fragmentary cross sections showing 8th and 9th steps in a process of manufacturing the DRAM of the second embodiment of the invention, respectively;

FIGS. 14A and 14B–18A and 18B are fragmentary cross sections showing 2nd to 6th steps in a process of manufacturing the DRAM of the third embodiment of the invention, respectively;

FIGS. 20A and 20B–22A and 22B are fragmentary cross sections showing 6th to 8th steps in a process of manufacturing the DRAM of the fourth embodiment of the invention, respectively;

FIGS. 24A and 24B–27A and 27B are fragmentary cross sections showing 4th to 7th steps in a process of manufacturing the DRAM of the fifth embodiment of the invention, respectively;

FIGS. 30A and 30B–36A and 36B are fragmentary cross sections showing 1st to 7th steps in a process of manufacturing the conventional DRAM, respectively;

DESCRIPTION OF THE PREFERRED EMBODIMENT

Embodiments of the invention will be described below with reference to FIGS. 1A and 1B to 27A and 27B.

First Embodiment

Figures 1A, 1B:
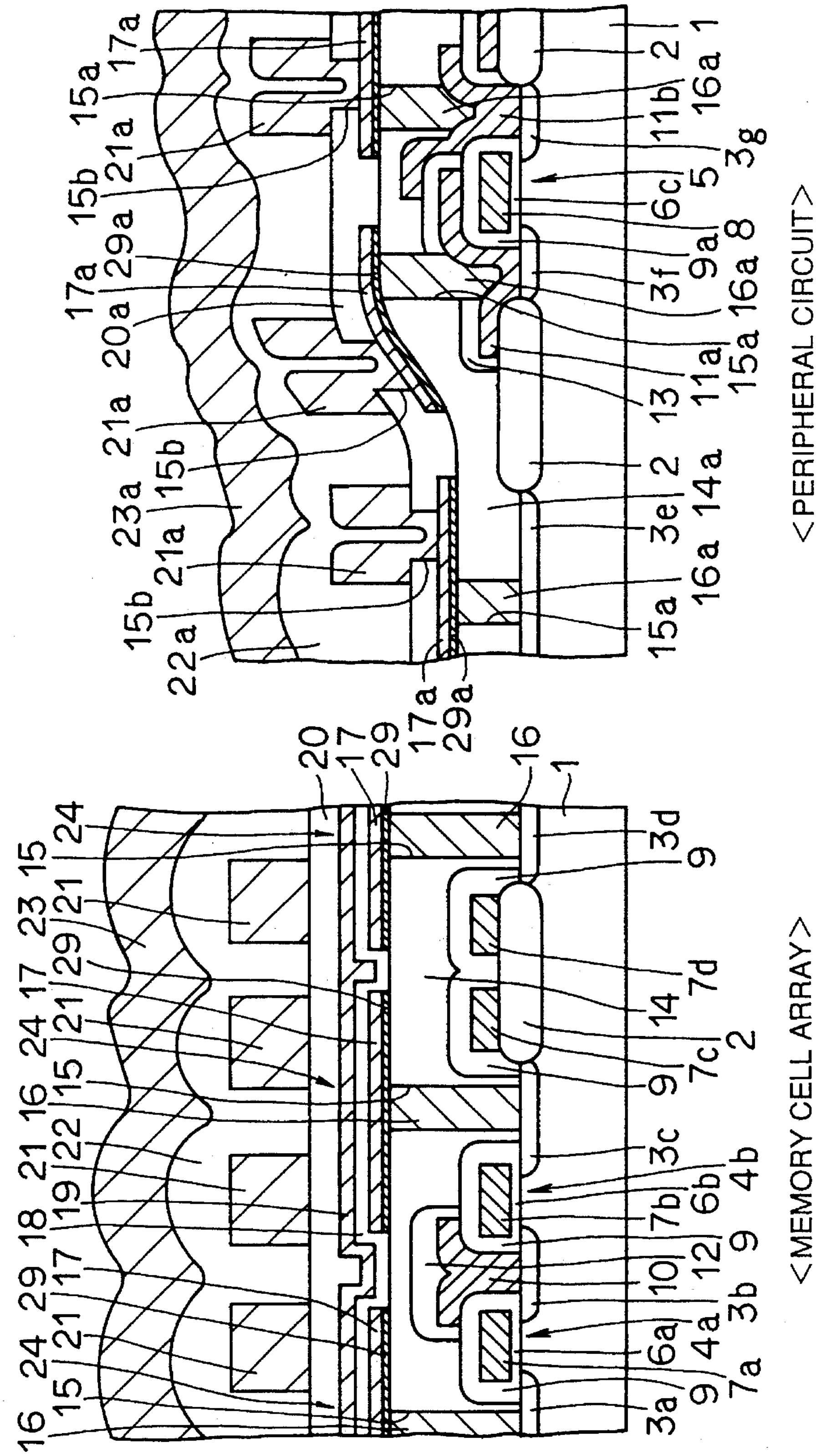
FIGS. 1A and 1B are fragmentary cross sections of a DRAM of a first embodiment of the invention.

A first embodiment of the invention will now be described below with reference to FIGS. 1A and 1B to 9A and 9B. FIGS. 1A and 1B are fragmentary cross sections of a DRAM of the first embodiment of the invention. FIGS. 2A and 2B–9A and 9B are fragmentary cross sections showing 1st to 8th steps in a process of manufacturing the DRAM of the first embodiment of the invention, respectively.

A structure of the DRAM of the first embodiment of the invention will be described below with reference to FIGS. 1A and 1B. Referring to FIG. 1A, a structure of a memory cell array (memory cell portion) of the DRAM of the invention is substantially the same as that of the memory cell array of the DRAM in the prior art. A field oxide film 2 is formed at an element isolating region on a main surface of a semiconductor substrate 1 of a p-type.

Transfer transistors 4*a* and 4*b* are formed at element forming regions on the main surface of semiconductor substrate 1. Transfer gate transistor 4*a* includes n-type impurity regions 3*a* and 3*b* forming source/drain regions, and a gate electrode (word line) 7*a* formed on a channel region between impurity regions 3*a* and 3*b* with a gate insulating film 6*a* therebetween.

Transfer gate transistor 4*b* includes n-type impurity regions 3*b* and 3*c* forming source/drain regions, and a gate electrode 7*b* formed on a channel region between impurity regions 3*b* and 3*c* with a gate insulating film 6*b* therebetween. Gate electrodes 7*c* and 7*d* of another transfer gate transistor are formed on field oxide film 2.

Gate electrodes (word lines) 7*a*, 7*b*, 7*c* and 7*d* are covered with oxide films 9. A buried bit line 10 electrically connected to impurity region 3*b* is formed on the predetermined impurity region 3*b*. Buried bit line 10 is covered with an insulating layer 12. Insulating layer 12 and oxide films 9 are covered with a first interlayer insulating film 14 which is made of a BPSG film and formed on the main surface of semiconductor substrate 1.

First interlayer insulating film 14 is provided at predetermined positions with first contact holes 15 extending up to surfaces of impurity regions 3*a*, 3*c* and 3*d*. First plug electrodes 16, made of polysilicon containing impurity introduced thereinto or tungsten (W), are formed in contact holes 15. Barrier layers 29 are formed on the top surfaces of first plug electrodes 16. Barrier layers 29 may be made of material such as TiN, Ta, Ti/TiN/Ti or Ti. Barrier layers 29 prevent diffusion between the material of capacitor lower electrode 17 and the material of first plug electrode 16.

Capacitor lower electrodes 17 are formed on barrier layers 29. Capacitor lower electrodes 17 may be made of noble metal of a high melting point such as platinum (Pt) or palladium (Pd), and preferably has a film thickness from about 500 Å to about 2000 Å.

Capacitor lower electrodes 17 are covered with a capacitor dielectric film 18. Capacitor dielectric film 18 may be made of material having a high dielectric constant such as $SrTiO_3$ (STO) or PZT, and preferably has a film thickness from about 500 Å to about 1000 Å.

Capacitor dielectric film 18 is covered with a capacitor upper electrode 19. Capacitor upper electrode 19 may be made of noble metal of a high melting point such as platinum (Pt), and preferably has a film thickness from about 500 Å to about 2000 Å.

Capacitor lower electrodes 17, capacitor dielectric film 18 and capacitor upper electrode 19 form a capacitor 24.

Capacitor upper electrode 19 is covered with a second interlayer insulating film 20 made of, e.g., a BPSG film. Second interlayer insulating film 20 has a film thickness of about 5000 Å to about 8000 Å.

First aluminum interconnection layers 21 are formed on second interlayer insulating film 20 with a space between each other. First aluminum interconnection layers 21 are covered with a protective film 22. A second aluminum interconnection layer 23 is formed on protective film 22.

Then, a structure of a peripheral circuitry (peripheral circuit portion) of the DRAM of the embodiment will be described below. Referring to FIG. 1B, the peripheral circuitry is also provided with field oxide films 2 at the element isolating regions on the main surface of semiconductor substrate 1. AMOS transistor 5 and an impurity region 3*e* are formed at element forming regions on the main surface of semiconductor substrate 1.

MOS transistor 5 includes impurity regions 3*f* and 3*g* forming source/drain regions, and a gate electrode 8 formed on a channel region between impurity regions 3*f* and 3*g* with a gate insulating film 6*c* therebetween. Polysilicon pads 11*a* and 11*b* are formed on impurity regions 3*f* and 3*g* and are electrically connected thereto, respectively. Polysilicon pad 11*a* is covered with an insulating layer 13.

Polysilicon pads 11*a* and 11*b* as well as impurity region 3*e* are covered with first interlayer insulating film 14*a*, which may be made of a BPSG film or the like.

First interlayer insulating film 14*a* is provided at its predetermined positions with second contact holes 15*a* having a depth from about 300 Å to about 1 μm. Thus, the second contact holes 15*a* are shallower than second contact holes 215*a* in the prior art. Thereby, the aspect ratio of second contact holes 15*a* can be smaller than that of second contact holes 215*a* in the prior art already described.

Second plug electrodes 16*a*, made of polysilicon containing impurity introduced thereinto or tungsten (W), are formed in second contact hole 15*a*. Second plug electrodes 16*a* are preferably made of the same material as that of first plug electrodes 16 already described.

Pad layers 17*a* are formed on second plug electrodes 16*a*. The pad layers 17*a* are preferably made of the same material as capacitor lower electrodes 17. Thereby, pad layers 17*a* can be formed at the same step as the capacitor lower electrodes 17. This allows formation of pad layers 17*a* in the peripheral circuitry without adding a new step.

In the above structure, a distance between pad layer 17*a* and the conductive layer on semiconductor substrate 1 is shorter than a distance between first aluminum interconnection layer 221*a* and the conductive layer on semiconductor substrate 201 in the prior art. As already described in connection with the prior art, however, insulation between them can be ensured owing to provision of first interlayer insulating film 14*a* having the above film thickness between pad layer 17*a* and the conductive layer on semiconductor substrate 1.

Pad layers 17*a* extend over the top surfaces of second plug electrodes 16*a* and first interlayer insulating film 14*a* as shown in FIG. 1. Pad layer 17*a* is preferably formed to have relatively large top and bottom surfaces. Thereby, pad layers 17*a* can be easily connected to second plug electrodes 16*a*. Thus, pad layers 17*a* can be formed easily. This also increases a degree of freedom relating to positions of third contact holes 15*b*, which will be formed on the pad layers 17*a* at a later step. Therefore, third contact holes 15*b* can be formed easily.

Owing to a high degree of freedom relating to positions of third contact holes 15*b*, third contact holes 15*b* can be formed at positions shifted from the positions of second contact holes 15*a*. Thereby, it is possible to ensure a relatively large area for forming first aluminum interconnection layers 21*a* even if the degree of integration increases. As a result, first aluminum interconnection layers 21*a* can be formed easily even if the degree of integration increases.

A second interlayer insulating film 20*a* is formed over pad layer 17*a*. Second interlayer insulating film 20*a* preferably has a film thickness from about 5000 Å to about 8000 Å, and may be made of material such as BPSG.

Second interlayer insulating film 20*a* is provided with third contact holes 15*b* located above pad layers 17*a*. Third contact holes 15*b* has a depth from about 5000 Å to about 8000 Å, which is smaller than that of second contact hole 215*a* in the prior art. Thereby, the aspect ration of third contact holes 15*b* can be smaller than that of second contact hole 215*a* in the prior art.

Bases of third contact holes 15*b* are formed of pad layer 17*a*. If platinum is selected as the material of pad layers 17*a*, good resistance against over-etching can be obtained when forming third contact holes 15*b*. Owing to the above matters, third contact holes 15*b* can be formed very easily.

First aluminum interconnection layers 21*a* are formed in third contact holes 15*b*. If platinum is selected as the material of pad layers 17*a*, the surfaces of pad layers 17*a* are hardly oxidized, because the platinum is stable metal. Therefore, good contact can be made between first aluminum interconnection layers 21*a* and pad layers 17*a*.

A protective film 22*a* is formed to cover first aluminum interconnection layers 21*a*. A second aluminum interconnection layer 23*a* is formed over protective film 22*a*.

Referring to FIGS. 2A and 2B to 9A and 9B, a method of manufacturing the DRAM of the first embodiment of the invention shown in FIG. 1 will be described below.

Figure 2B:
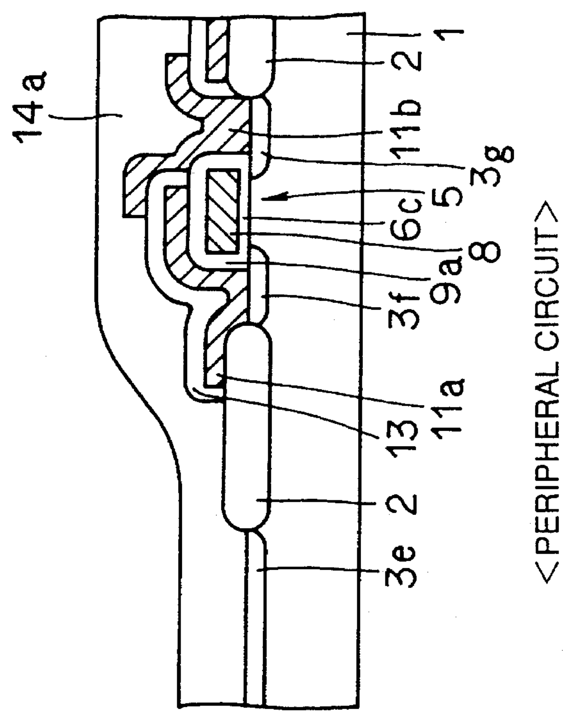
Figure 2A:
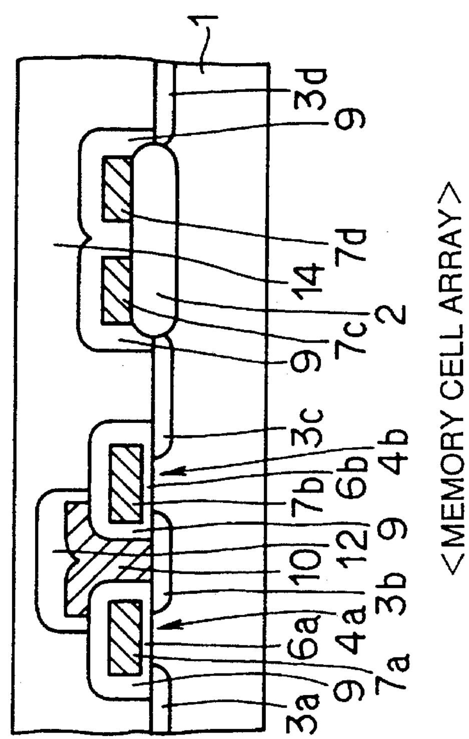

Referring to FIGS. 2A and 2B, the same process as the prior art is performed to form transfer gate transistors 4*a* and 4*b*, buried bit line 10, gate electrodes 7*c* and 7*d*, and field oxide film 2 in the memory cell array. Also, MOS transistor 5, polysilicon pads 11*a* and 11*b*, and field oxide film 2 are formed in the peripheral circuitry. The CVD method or the like is carried out to form first interlayer insulating films 14 and 14 made of, e.g., BPSG films on the whole main surface of semiconductor substrate 1. First interlayer insulating films 14 and 14*a* thus formed preferably have a film thickness from about 3000 Å to about 1 μm.

Figure 3B:
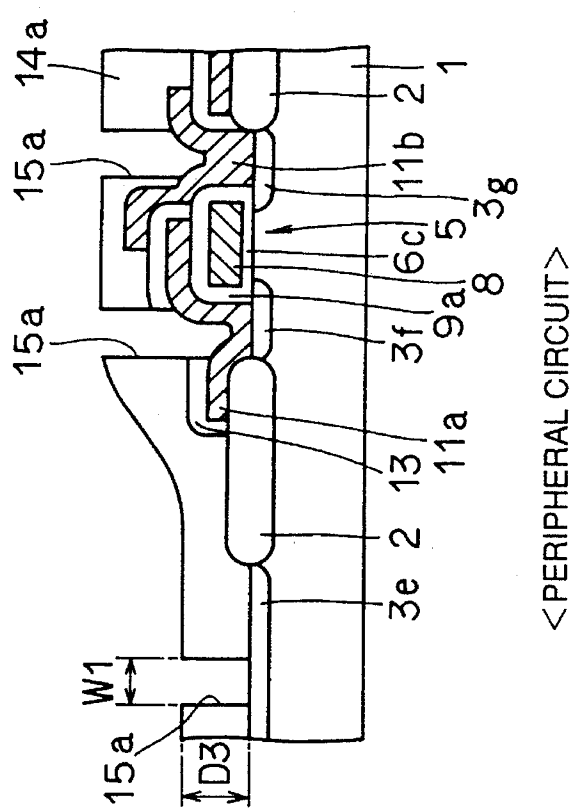
Figure 3A:
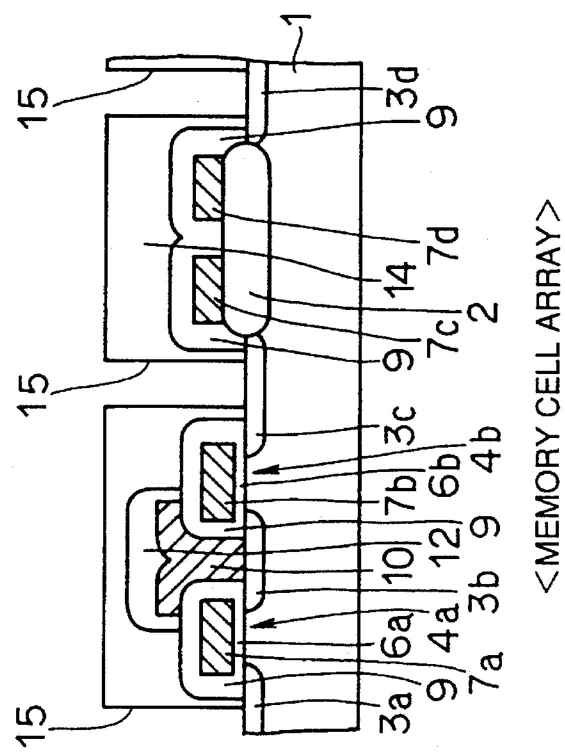

Referring to FIGS. 3A and 3B, first contact holes 15 reaching the surfaces of impurity regions 3*a*, 3*c* and 3*d* are formed at predetermined positions in the memory cell array. Simultaneously, second contact holes 15*a* which reach the surfaces of impurity region 3*e* and polysilicon pads 11*a* and 11*b*, respectively, are formed at predetermined positions in first interlayer insulating film 14*a* of the peripheral circuitry.

Second contact holes 15*a* in the peripheral circuitry have a depth D3 from about 3000 Å to about 1 μm, and also have an open width W1 from about 0.6 μm to about 0,8 μm. Therefore, the aspect ratio of second contact holes 15*a* is in a range from about 0.4 to about 1.7, and thus is smaller than the disadvantageously large aspect ration from about 2 to about 3 of the contact holes 215*a* formed at the peripheral circuitry in the prior art. This facilitates formation of second contact holes 15*a*, compared with second contact holes 215*a* in the prior art.

Figure 4B:
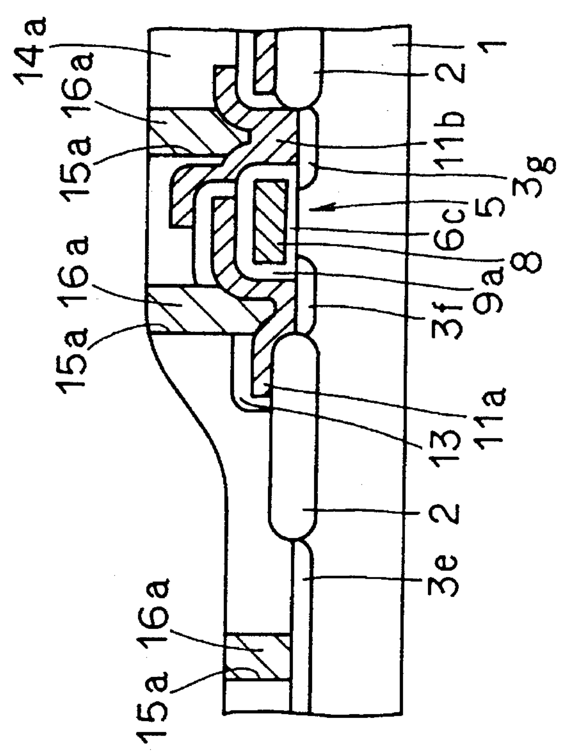
Figure 4A:
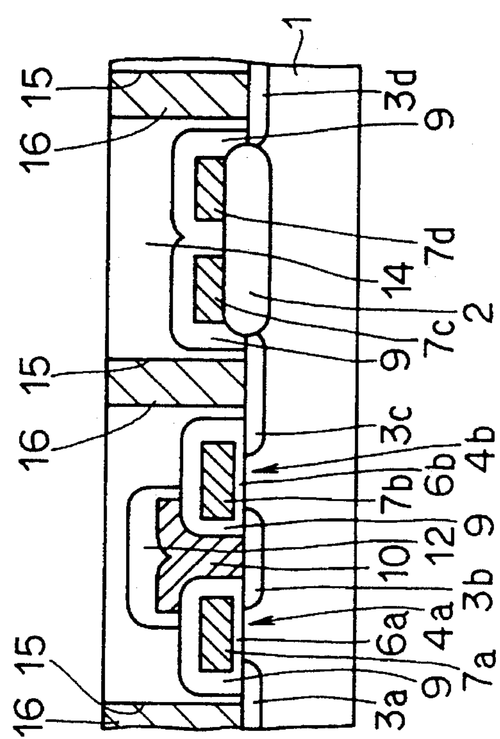

Referring to FIGS. 4A and 4B, first and second plug electrodes 16 and 16*a*, e.g., of polysilicon are formed in first and second contact holes 15 and 15*a* in a manner described below, respectively.

First, the CVD method or the like is used to form a polysilicon layer, which fills first and second contact holes 15 and 15*a*, on the main surface of semiconductor substrate. The polysilicon layer thus formed preferably contains impurity introduced thereinto. Etchback is effected on the polysilicon layer to form first and second plug electrodes 16 and 16*a* made of polysilicon in first and second contact holes 15 and 15*a*, respectively.

However, if a CMOS (Complementary Metal Oxide Semiconductor) device is formed in the peripheral circuitry, formation of first and second plug electrodes 16 and 16*a* in the above manner may cause a following problem due to the fact that the CMOS has a pMOS and an nMOS.

The conductivity type of impurity regions 3*a*, 3*b*, 3*c* and 3*d* formed in the memory cell array is n-type in this embodiment. Therefore, impurity of n-type is introduced into the polysilicon layer forming first and second plug electrodes 16 and 16*a*. Therefore, second plug electrodes 16*a* containing impurity of n-type is formed also on the impurity region of pMOS. However such a technique increases the resistance of those portions having underlying p-type regions.

In order to overcome the above problem, the undoped polysilicon may be deposited for forming first and second plug electrodes 16 and 16*a*. Etchback is effected on the undoped polysilicon layer to form plug electrodes 16 and 16*a* in first and second contact holes 15 and 15*a*. Thereafter ion-implantation is carried out to implant n-type impurities into those plugs overlying n-type regions and p-type impurities into those plugs overlying p-type regions.

Thereby, first and second plug electrodes 16 and 16*a* are formed. In this manner, it is possible to form first and second plug electrodes 16 and 16*a* of the conductivity type corresponding to the conductivity type of impurity regions formed at the main surface of semiconductor substrate 1.

Figure 5B:
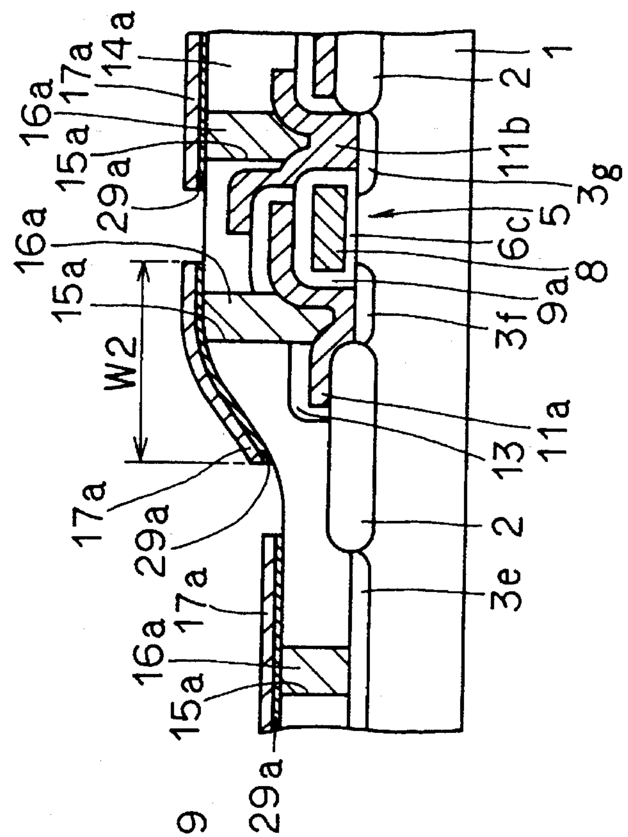
Figure 5A:
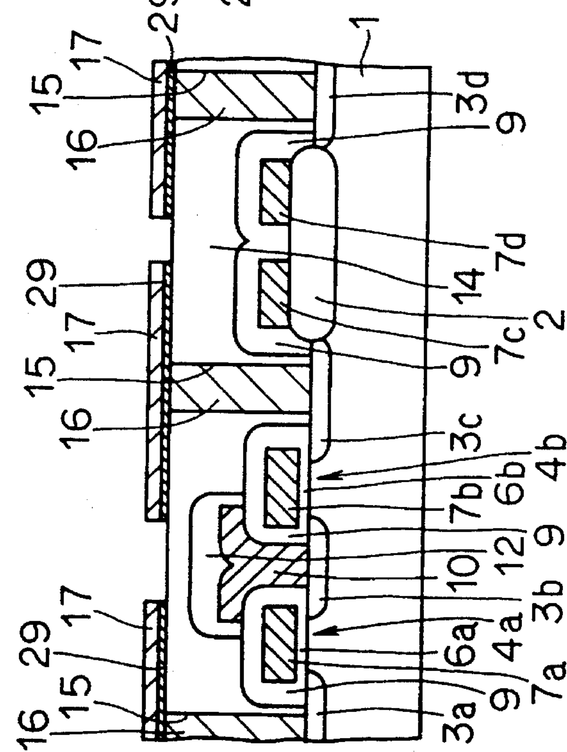

Referring to FIGS. 5A and 5B, a sputtering method or the like is used to deposit a barrier layer on first and second plug electrodes 16 and 16*a* and first interlayer insulating films 14 and 14*a*. A platinum layer having a predetermined film thickness is deposited on the barrier layer, e.g., by a sputtering method.

The platinum layer and barrier layer are patterned into predetermined configurations. Thereby, barrier layers 29 and capacitor lower electrodes 17 are formed in the memory cell array, and simultaneously, barrier layers 29*a* and pad layers 17*a* are formed in the peripheral circuitry.

Pad layer 17*a* thus formed in the peripheral circuitry preferably has a plan width W2 from about 1 μm to about 2 μm. Pad layers 17*a* may have any appropriate shape.

Figure 6B:
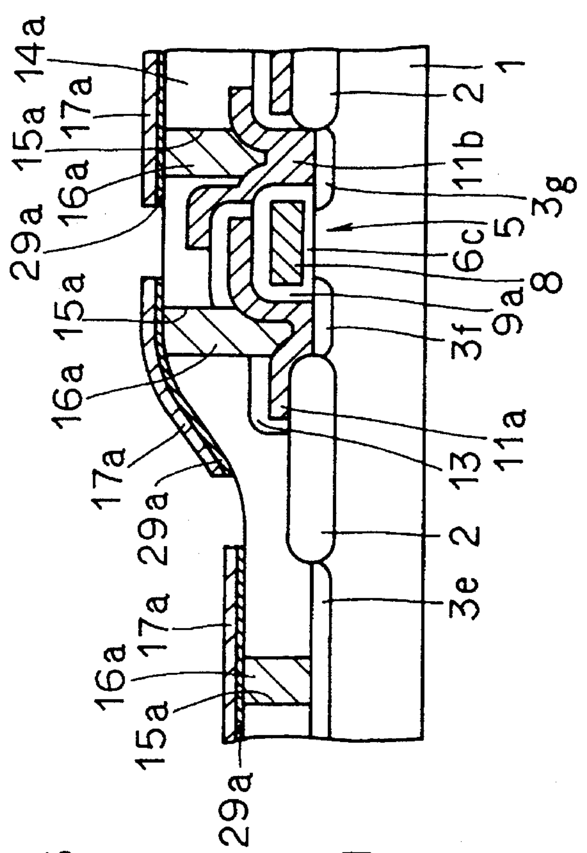
Figure 6A:
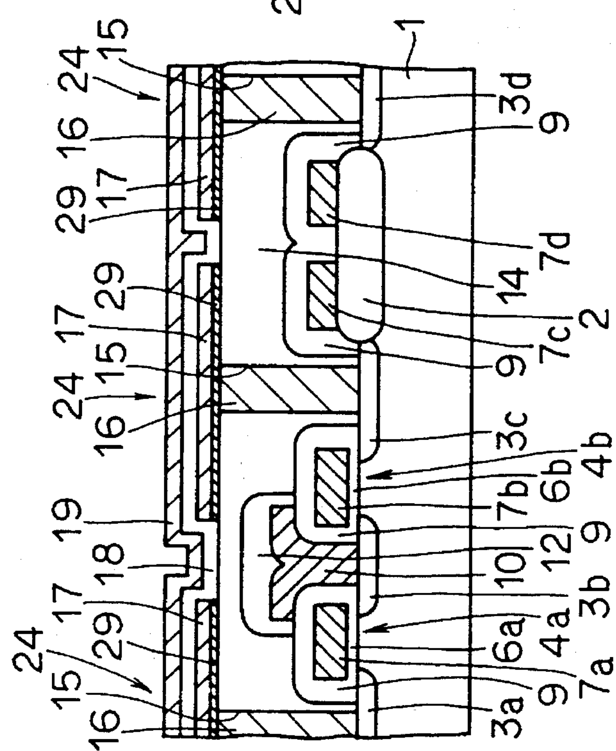

Referring to FIGS. 6A and 6B, capacitor dielectric film 18 is formed to cover capacitor lower electrodes 17 in the memory cell array, e.g., by a sputtering method. Capacitor dielectric film 18 is made of high dielectric material such as $SrTiO_3$.

Capacitor upper electrode 19 made of, e.g., platinum is formed to cover capacitor dielectric film 18, e.g., by a sputtering method. Thereby, the capacitors 24 including capacitor upper electrode 19, capacitor dielectric film 18 and capacitor lower electrodes 17 are formed in the memory cell array 24.

Figure 7B:
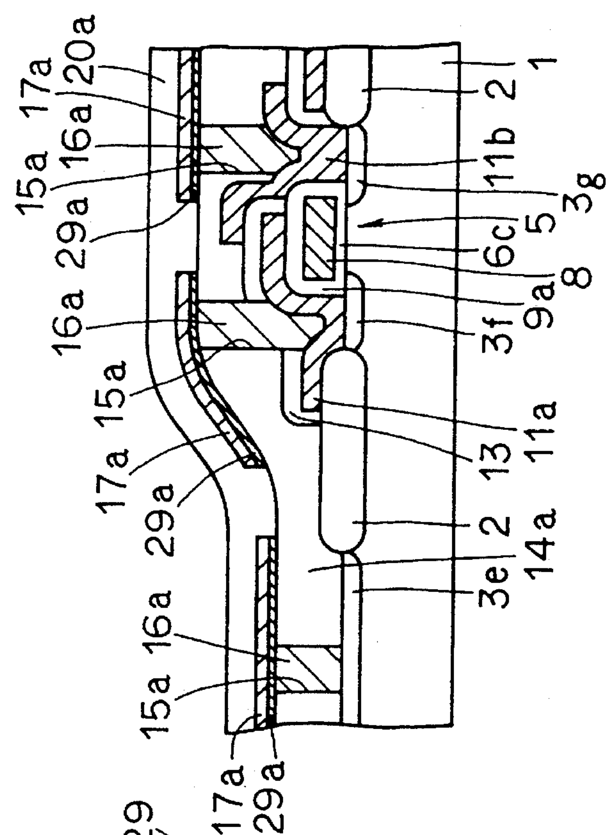
Figure 7A:
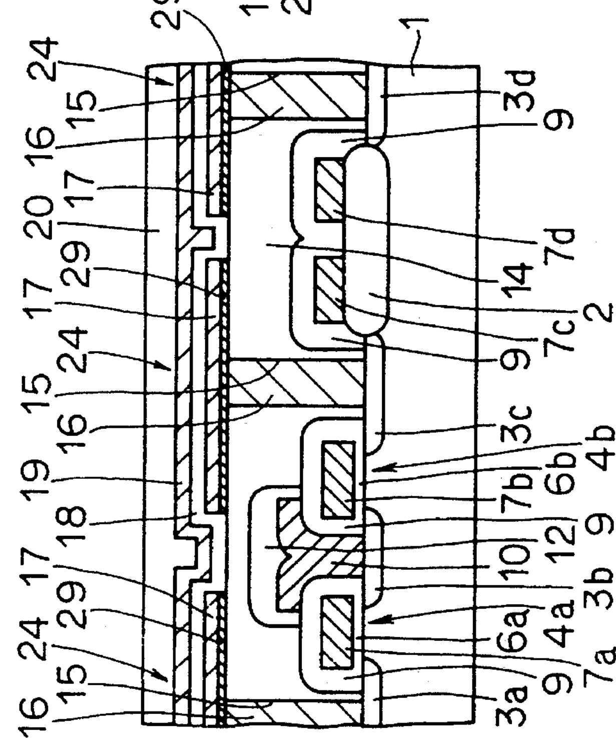

Referring to FIGS. 7A and 7B, second interlayer insulating films 20 and 20*a* made of, e.g., BPSG are formed to cover capacitor upper electrode 19 and pad layers 17*a* by a CVD method or the like, respectively. Second interlayer insulating films 20 and 20*a* preferably have a film thickness from about 5000 Å to about 8000 Å.

Figures 8A, 8B:
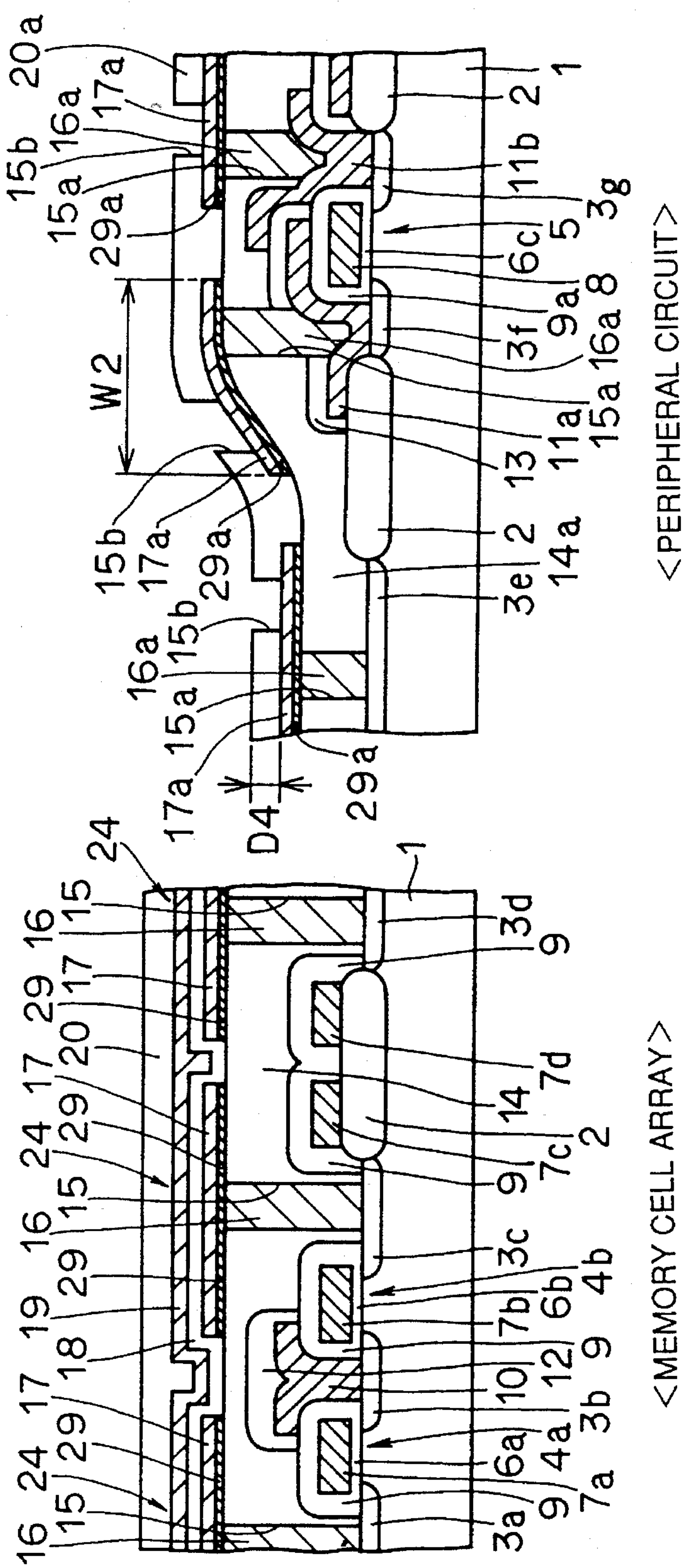

Referring to FIGS. 8A and 8B, third contact holes 15*b* are formed in the second interlayer insulating film 20*a*. Third contact holes 15*b* are located above pad layers 17*a*. Therefore, the degree of freedom relating to the positions of third contact holes 15*b* can be increased, because pad layers 17*a* each have a relatively large plan width W2 as already described.

Since the film thickness of second interlayer insulating film 20*a* is in a range from about 5000 Å to about 8000 Å, third contact hole 15*b* has a depth D4 smaller than the depth D2 of second contact hole 215*a* in the prior art. Therefore, the aspect ratio of third contact hole 15*b* is smaller than the aspect ratio of second contact hole 215*a* in the prior art. Therefore, third contact holes 15*b* can be formed easily.

Figure 9B:
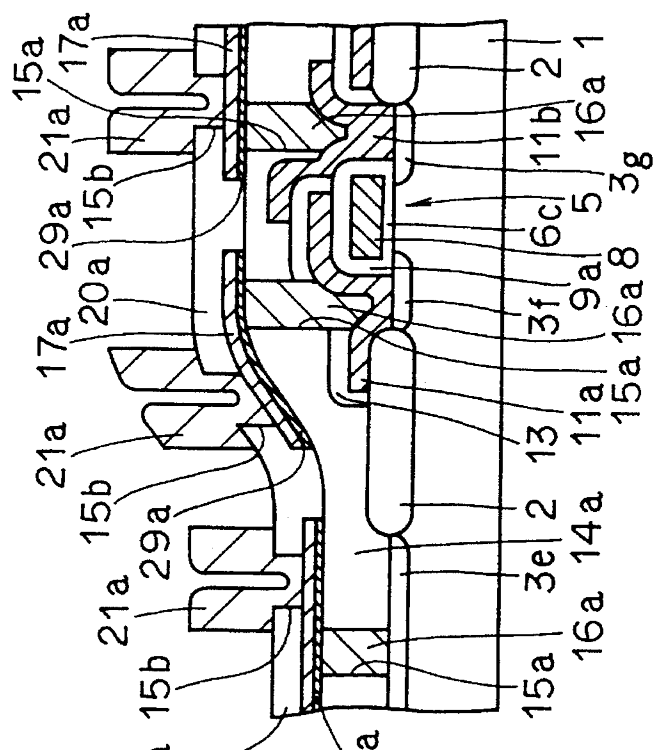
Figure 9A:
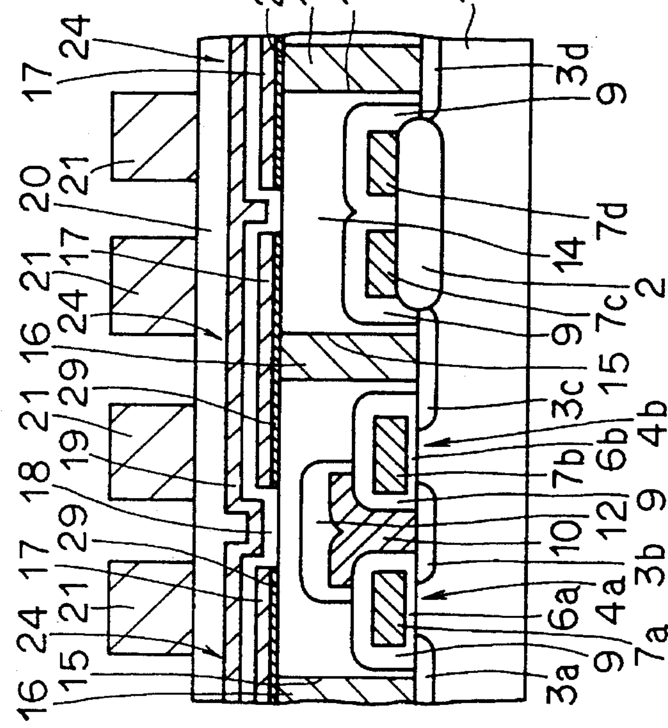

Referring to FIGS. 9A and 9B, first aluminum interconnection layers 21 are formed on second interlayer insulating film 20 in the memory cell array with a predetermined space between each other. At the same time, first aluminum interconnection layers 21*a* are formed in third contact holes 15*a* of the peripheral circuitry. In connection with this, pad layers 17*a* are made of platinum, and thus are resistive to oxidation. Therefore, good contact can be obtained between first aluminum interconnection layers 21*a* and pad layers 17*a*.

Thereafter, steps similar to those in the prior art are carried out to form protective films 22 and 22*a* as well as second aluminum interconnection layers 23 and 23*a*. Thereby, the DRAM of the first embodiment shown in FIGS. 1A and 1B is completed.

Second Embodiment

Figures 10A, 10B:
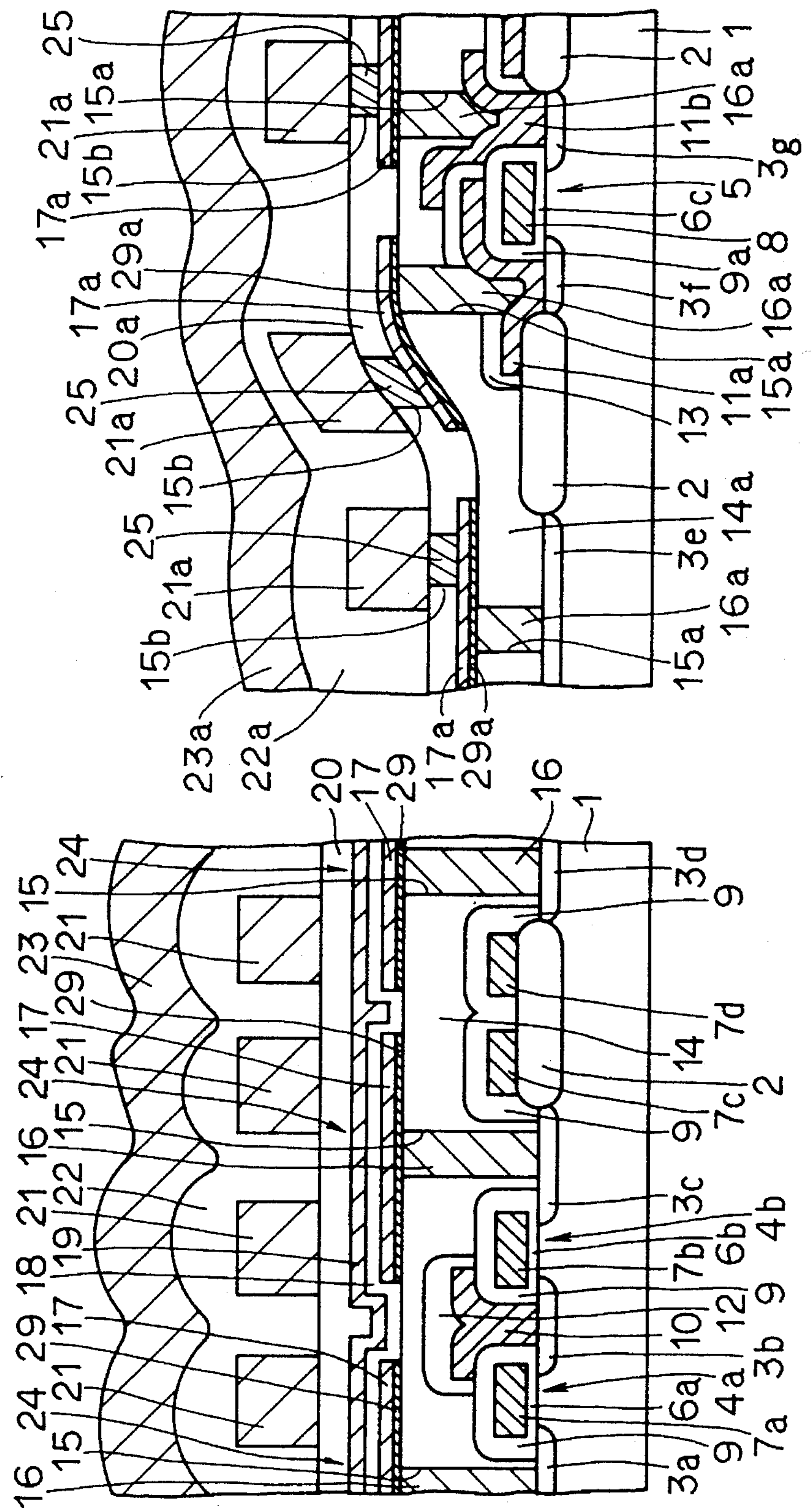
FIGS. 10A and 10B are fragmentary cross sections of a DRAM of a second embodiment of the invention.

Referring to FIGS. 10A and 10B to 12A and 12B, a second embodiment of the invention will be described below. FIGS. 10A and 10B are fragmentary cross sections showing a DRAM of the second embodiment of the invention. FIGS. 11A and 11B–12A and 12B are cross sections showing 8th and 9th steps in the process of manufacturing the DRAM of the second embodiment of the invention, respectively.

Referring first to FIGS. 10A and 10B, a structure of the DRAM of the second embodiment of the invention will be described be described below. In the embodiment shown in FIG. 10, the peripheral circuitry is provided with third plugs 25 which are made of tungsten (W) or the like and are formed in third contact holes 15*b*. The rest of the structure is substantially the same as the DRAM of the first embodiment. Similarly to the first embodiment, therefore, second and third contact holes 15*a* and 15*b* as well as first aluminum interconnection layers 21*a* can be formed more easily than the prior art.

Owing to provision of third plug electrodes 25, reliability of the contacts between first aluminum interconnection layers 21*a* and pad layers 17*a* can be improved because of the following reason.

Figure 37:
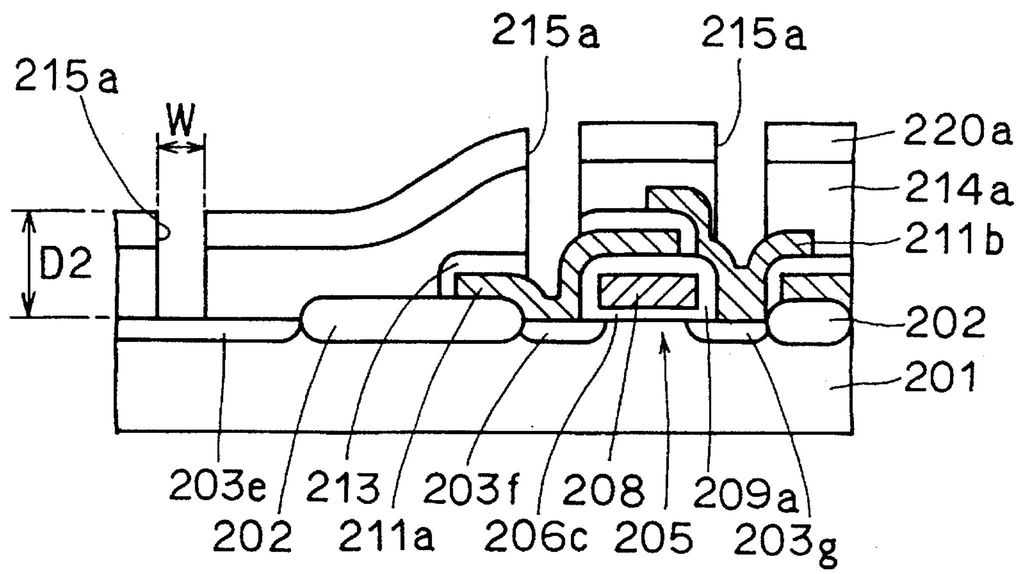
FIG. 37 shows a first problem of the conventional DRAM, and is a fragmentary cross section showing a peripheral circuitry of the DRAM at a 5th step in a process of manufacturing the conventional DRAM.
Figure 38:
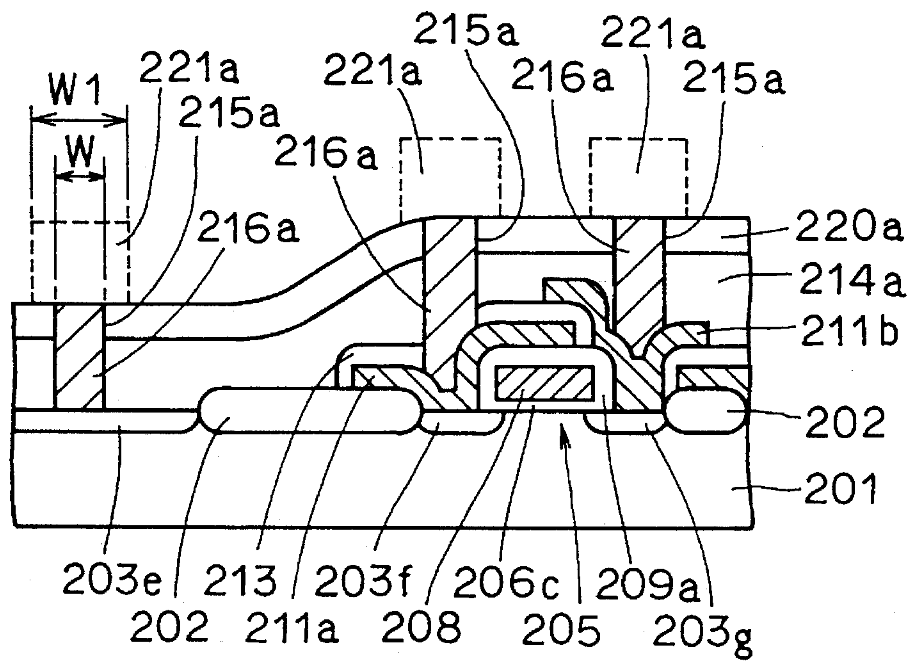
FIG. 38 shows a third problem of the conventional DRAM, and is a fragmentary cross section showing a 7th step in the process of manufacturing the conventional DRAM.

First aluminum interconnection layers 21*a* are generally formed by the sputtering method. Therefore, they may not closely cover irregular or stepped surfaces. Meanwhile, depth D4 (shown in FIG. 8B) of contact hole 15*b* is smaller than depth D2 (shown in FIG. 37) of second contact hole 215*a* in the peripheral circuitry of the prior art as described above, but has a certain magnitude.

Therefore, if first aluminum interconnection layers 21*a* were formed directly in third contact holes 15*b*, as in the first embodiment, first aluminum interconnection layers 21a might break in third contact holes 15b because the step coverage of aluminum interconnection layers 21a is poor.

In contrast to the above, this second embodiment is provided with third contact holes 15b filled with third plug electrodes 25, so that the problem of breakage of first aluminum interconnection layers 21a described above does not substantially generate.

Figure 11B:
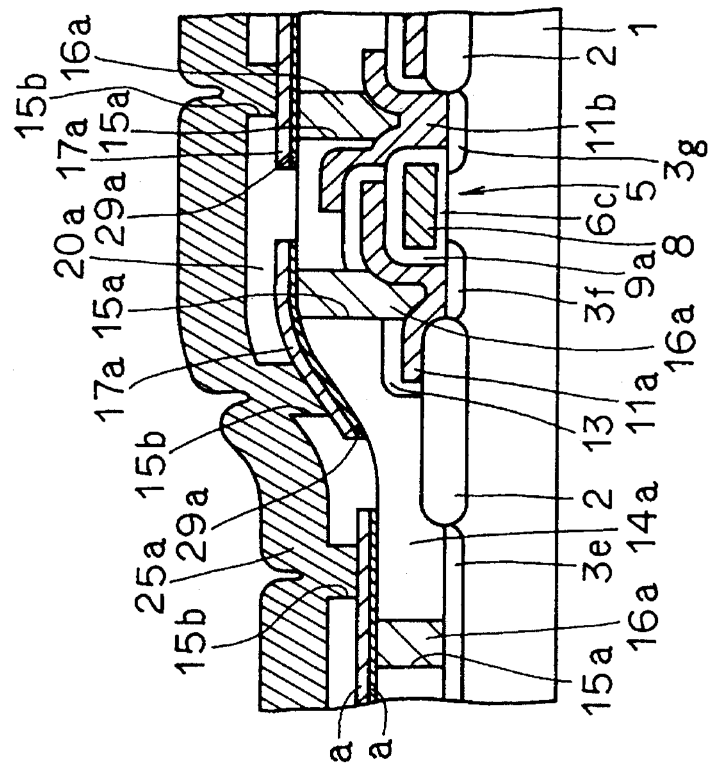
Figure 11A:
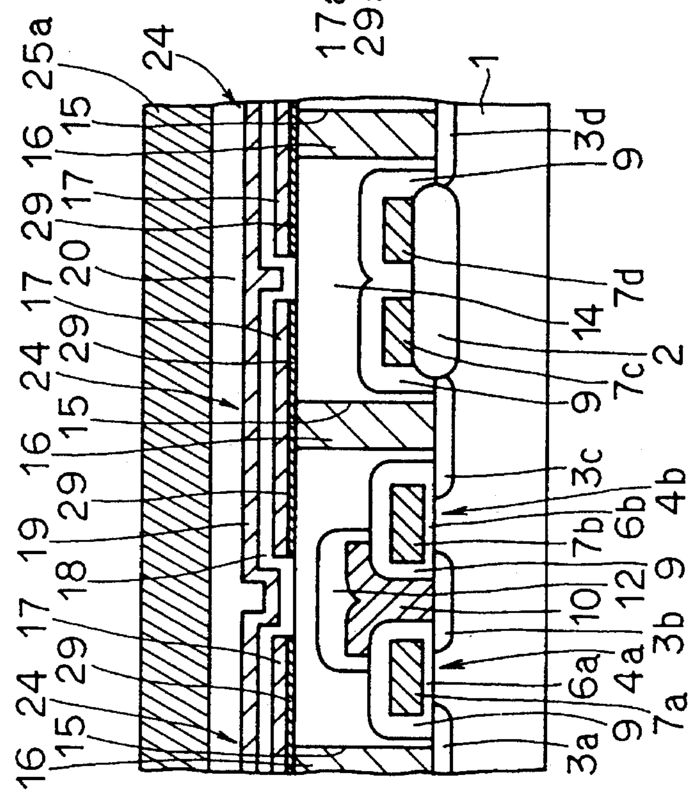

Referring to FIGS. 11A and 11B–12A and 12B, a process of manufacturing the DRAM of the second embodiment according to the invention will be described below. Referring first to FIGS. 11A and 11B, a process from the initial step to the step of forming third contact holes 15 is carried out similarly to that of the first embodiment. Then, a CVD method or the like is used to deposit a conductive layer of tungsten (W) or the like filling third contact holes 15b.

Figures 12A, 12B:
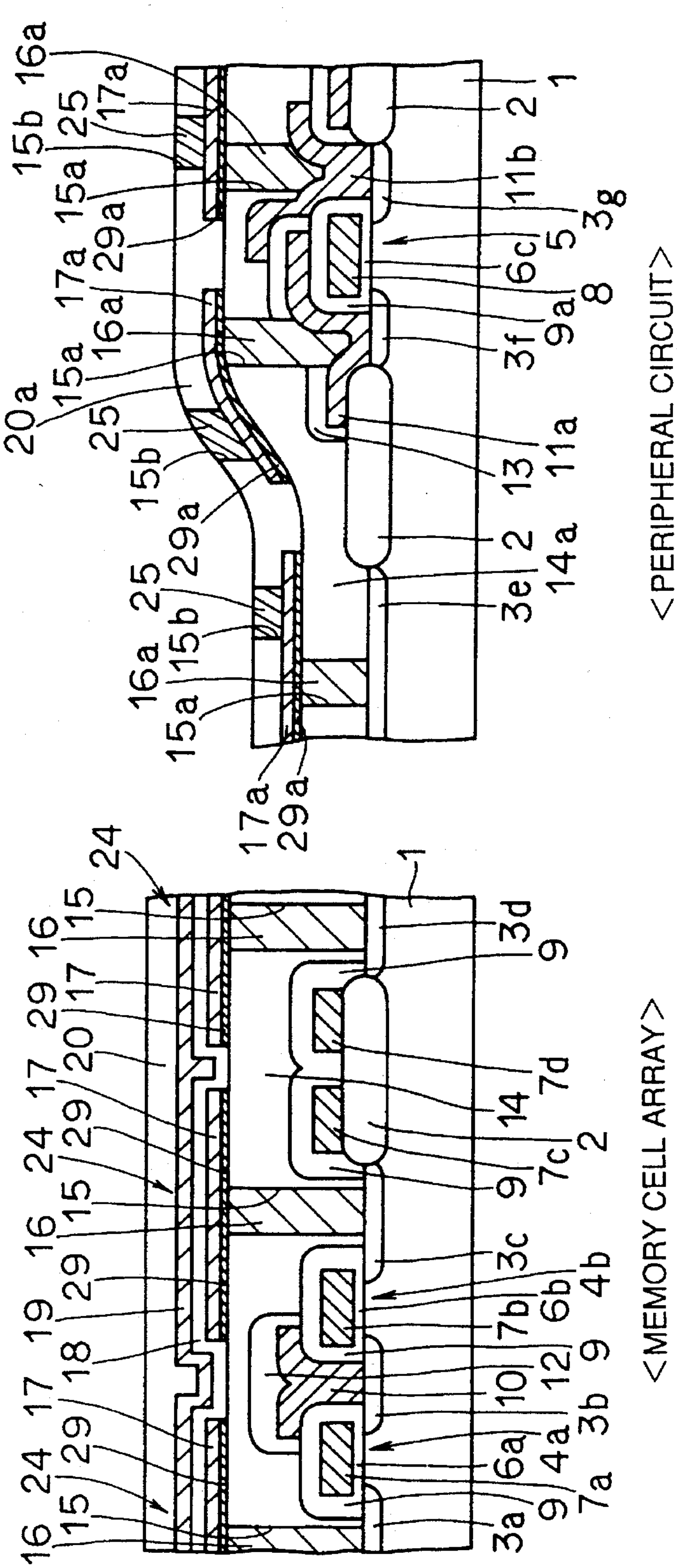

Etchback is effected on conductive layer 25a to form third plug electrodes 25 in third contact holes 15b as shown in FIGS. 12A and 12B. Thereafter, the same steps as those of the first embodiment are carried out to form sequentially first aluminum interconnection layers 21a and 21, protective films 22 and 22a and second aluminum interconnection layers 23 and 23a. Thereby, the DRAM of the second embodiment shown in FIGS. 10A and 10B is completed.

This embodiment uses a process of forming plug electrodes 25 in spite of the fact that the process is expensive, and thus the manufacturing cost is larger than that of the first embodiment. However, the second embodiment can further improve the reliability of the contacts between pad layers 17a and first aluminum interconnection layers 21a.

Third Embodiment

Figure 17B:
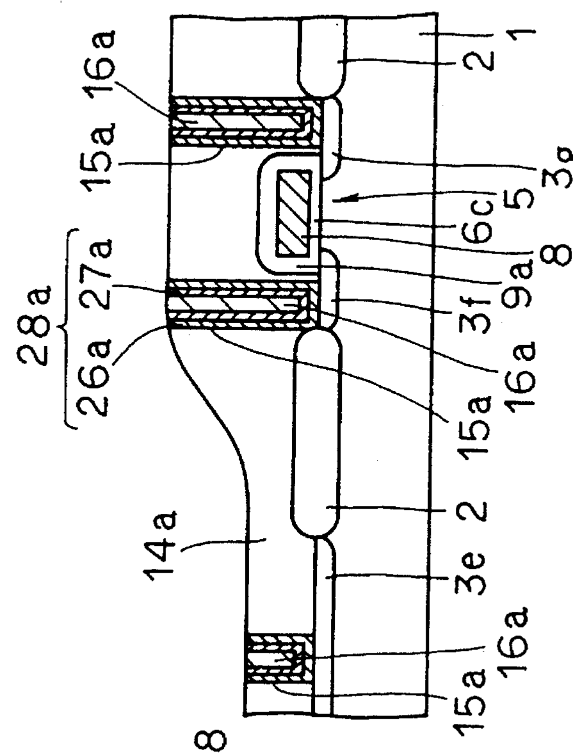
Figure 17A:
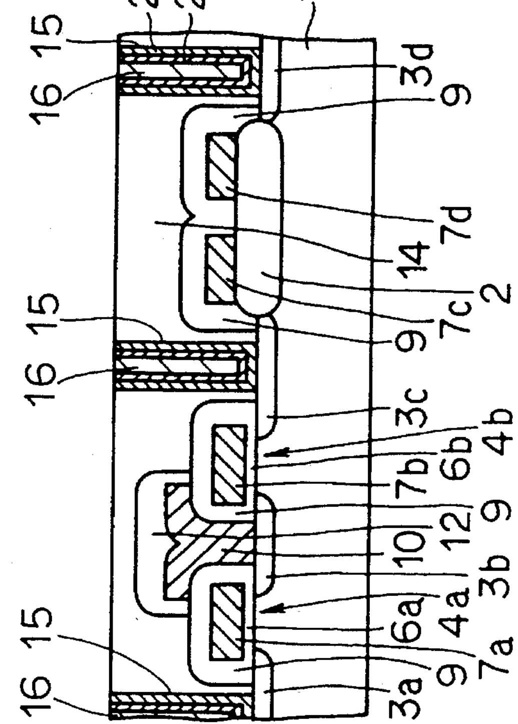
Figure 18B:
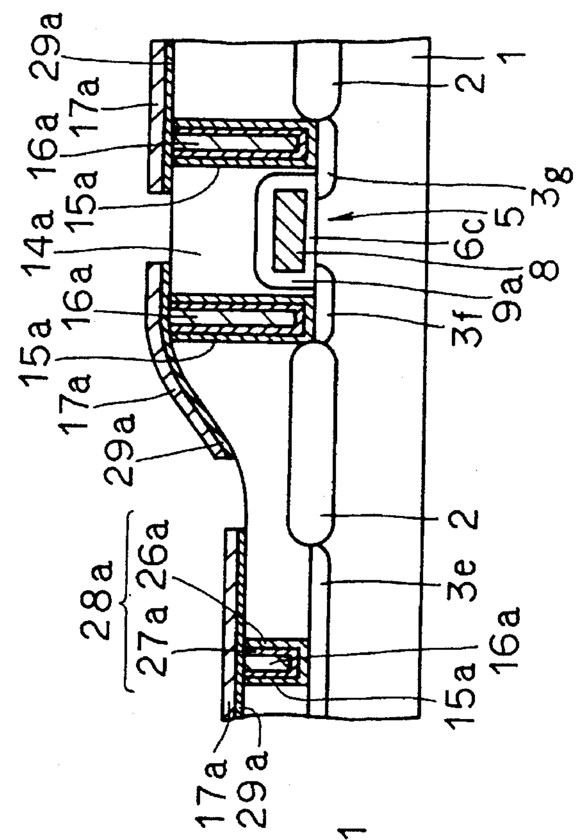
Figure 18A:
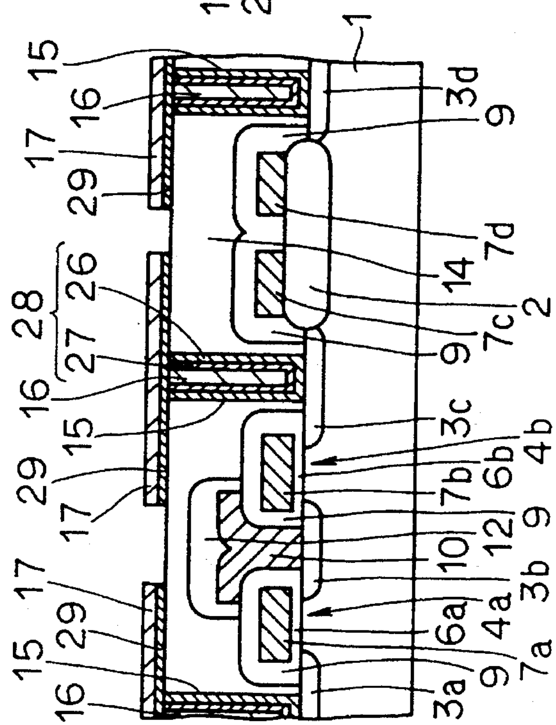

Then, a third embodiment of the invention will be described below with reference to FIGS. 13A and 13B to 18A and 18B. FIGS. 18A and 18B are fragmentary cross sections showing a DRAM of the third embodiment of the invention. FIGS. 14A and 14B to 18A and 18B are fragmentary cross sections showing 2nd to 6th steps in a process of manufacturing the DRAM of the third embodiment of the invention.

Figures 13A, 13B:
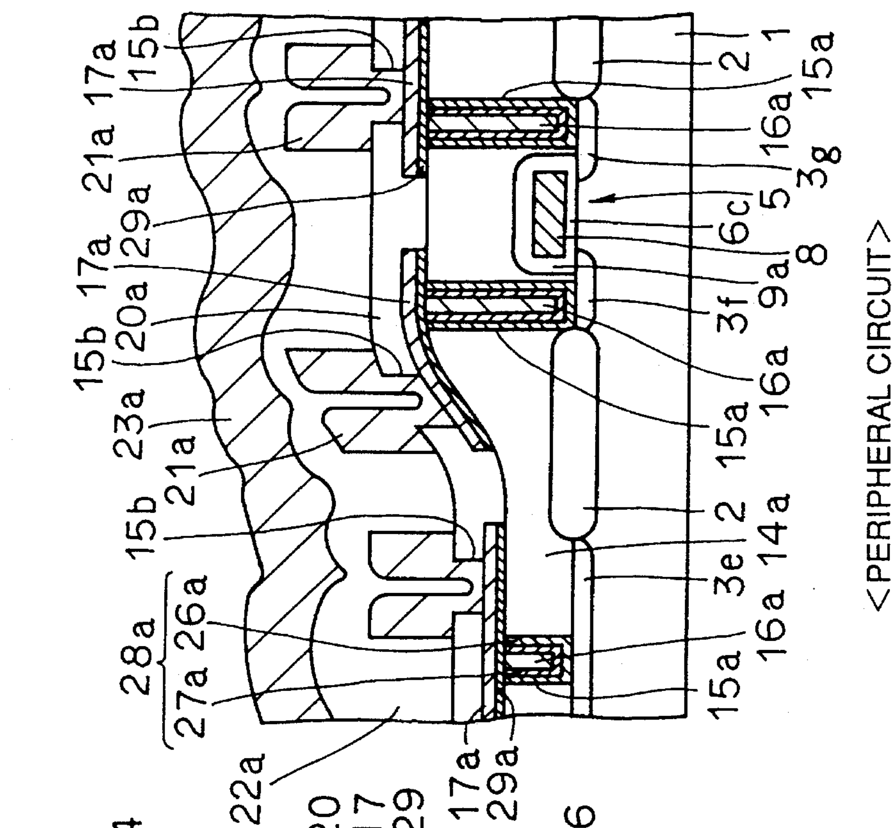
FIGS. 13A and 13B are fragmentary cross sections of a DRAM of a third embodiment of the invention.

Referring first to FIGS. 13A and 13B, the structure of the DRAM of the third embodiment of the invention will be described below. As shown in FIGS. 13A and 13B, this embodiment is provided with a barrier layer 28 between an inner surface of each first contact hole 15 and first plug electrode 16. In this embodiment, barrier layer 28 includes a Ti layer 26 and a TiN layer 27 formed on Ti layer 26. Barrier layer 28 may be formed of any other material preventing mutual diffusion between the material of plug electrode 16 and the material of semiconductor substrate 1.

Likewise, the peripheral circuitry is provided with barrier layers 28a formed between inner surfaces of second contact holes 15a and second plug electrodes 16a. Each barrier layer 28a includes a Ti layer 26a and a TiN layer 27a formed on Ti layer 26a. Ti layers 26 and 26a preferably have a film thickness from about 50 Å to about 100 Å. TiN layers 27 and 27a preferably have a film thickness of about 500 Å. The rest of the structure is substantially the same as that of the first embodiment. Therefore, similarly to the first embodiment, second and third contact holes 15a and 15b as well as first aluminum interconnection layers 21a can be formed more easily than the prior art.

Provision of barrier layers 28 and 28a can achieve advantages, which will be described below in connection with two cases, i.e., the case where first and second plug electrodes 16 and 16a are made of polysilicon and the case where they are made of tungsten (W).

If polysilicon is selected as the material of first and second plug electrodes 16 and 16a, provision of barrier layers 28 and 28a enables easy manufacturing even in the case where a CMOS device is formed in the peripheral circuitry.

More specifically, all of second plug electrodes 16a can be set to have the same conductivity type. Therefore, it is not necessary to carry out ion implantation for changing the conductivity type of second plug electrode 16a, which is required in the first embodiment. Consequently, second plug electrodes can be formed easily.

Owing to provision of barrier layers 28 and 28a, it is possible to make ohmic contact between the impurity regions formed on the main surface of semiconductor substrate 1 and first and second plug electrodes 16 and 16a. Therefore, the contact resistance can be reduced.

If tungsten (W) is selected as the material of first and second plug electrodes 16 and 16a, provision of barrier layers 28 and 28a can prevent reaction of semiconductor substrate 1 and the tungsten (W). Also owing to provision of barrier layers 28 and 28a, adhesion between semiconductor substrate 1 and first and second plug electrodes 16 and 16a can be improved compared with the case where barrier layers 28 and 28a are not provided.

Figure 14B:
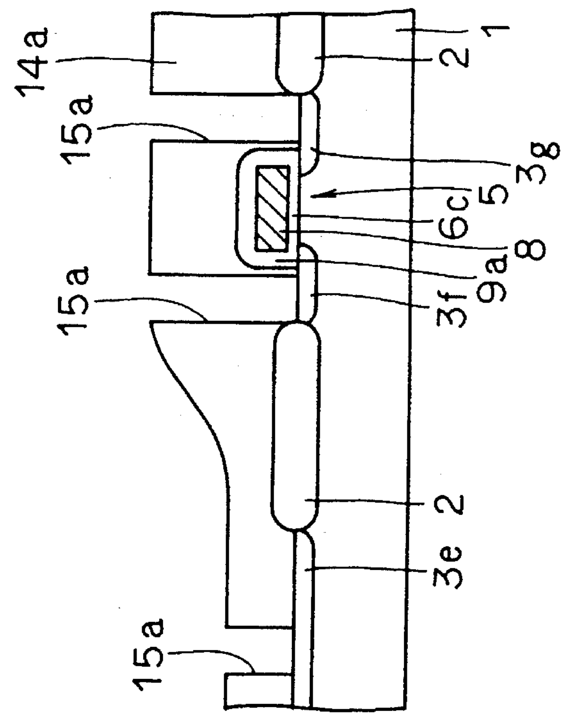
Figure 14A:
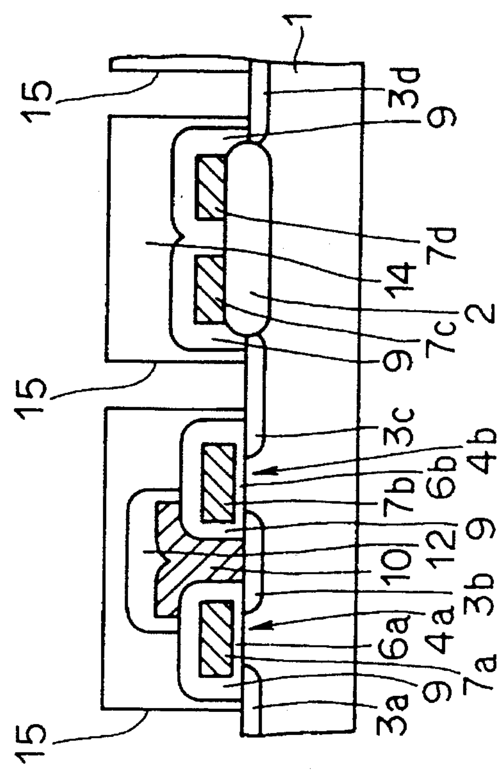

A process of manufacturing the DRAM of the third embodiment of the invention will be described below with reference to FIGS. 14A and 14B to 18A and 18B. Referring to FIG. 14A and 14B, a process from the initial step to the step of forming first interlayer insulating films 14 and 14a is carried out similarly to that of the first embodiment. However in contrast to the first embodiment, polysilicon pads 11a and 11b are not formed on impurity regions 3f and 3g in the peripheral circuitry according to this embodiment.

Polysilicon pads 11a and 11b can provide such a merit that a maximum allowable magnitude of dislocation of a mask can be relatively large when forming second contact holes 15a. However, provision of polysilicon pads 11a and 11b unpreferably complicates the manufacturing steps. Therefore, it is preferable not to form polysilicon pads 11a and 11b if possible.

In view of the above matters, this embodiment is designed not to provide polysilicon pads 11a and 11b. Therefore, a maximum allowable magnitude of dislocation of the mask can be relatively small when forming second contact holes 15a, but the manufacturing cost can be reduced.

Figure 15B:
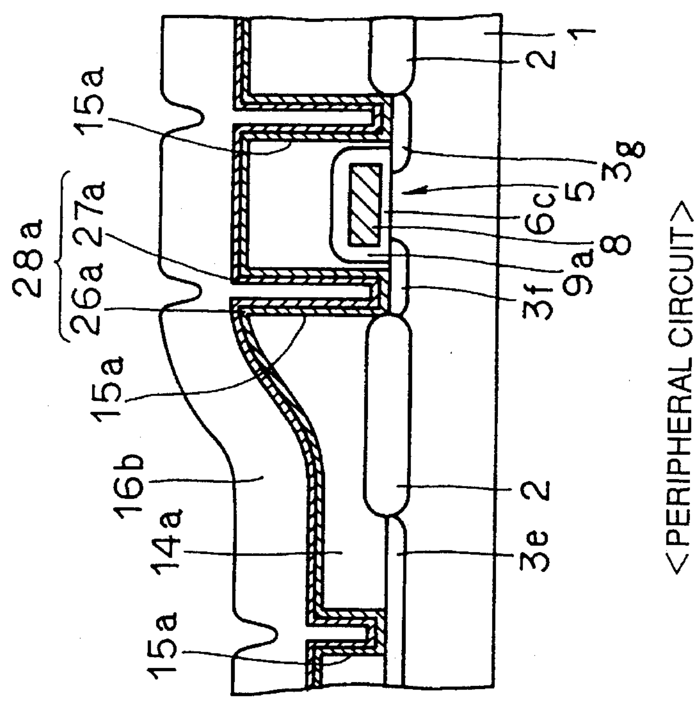
Figure 15A:
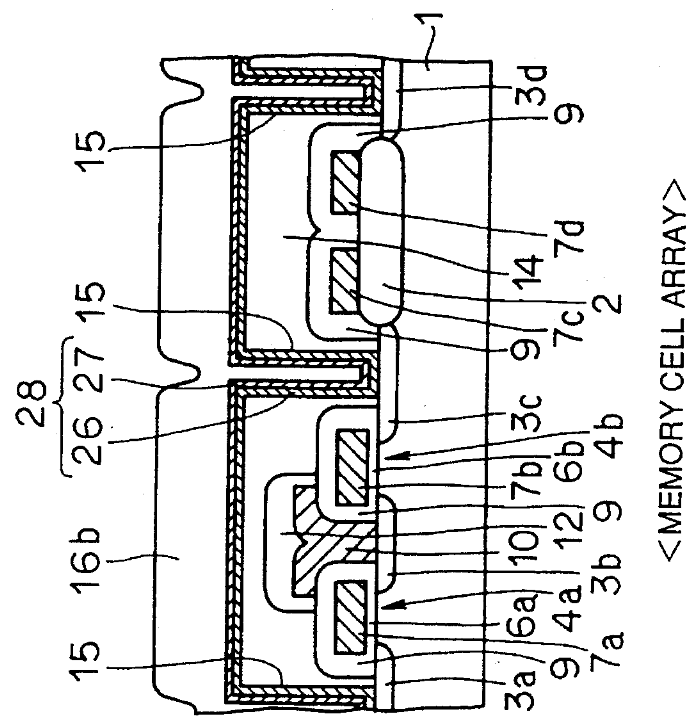

Anisotropic etching is effected on first interlayer insulating films 14 and 14a to form first and second contact holes 15 and 15a reaching the surfaces of impurity regions 3a, 3c, 3d, 3e, 3f and 3g. Referring to FIGS. 15A and 15B, a sputtering method or the like is used to form Ti layer 26 and TiN layer 27 on first interlayer insulating films 14 and 14a including inner surfaces of first and second contact holes 15 and 15a.

A CVD method or the like is used to deposit on TiN layer 27 a conductive layer 16b, for example, made of tungsten (W) or polysilicon containing impurity introduced thereinto. In this step, conductive layer 16b is formed to fill first and second contact holes 15 and 15a.

Figure 16B:
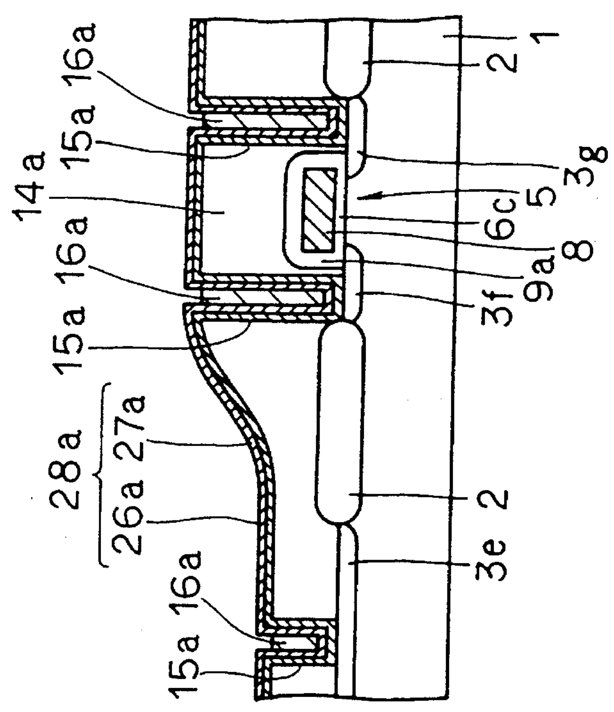
Figure 16A:
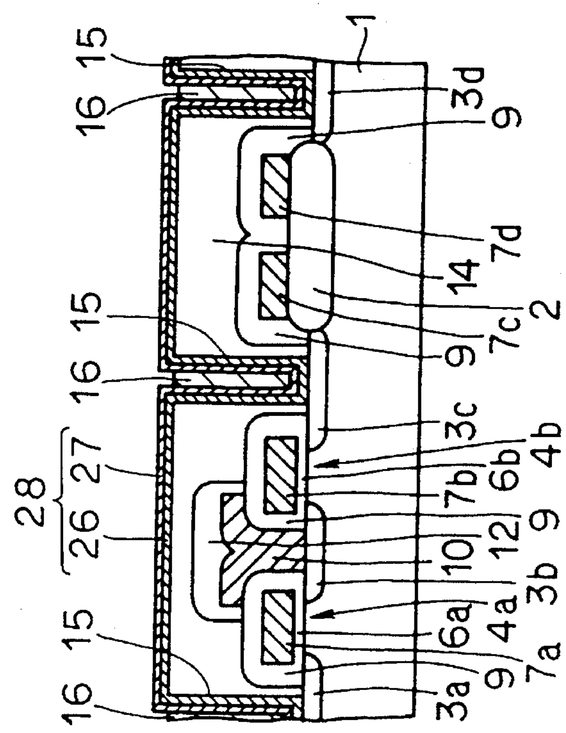

Then, etchback is effected on conductive layer 16b. Thereby, as shown in FIGS. 16A and 16B, first and second plug electrodes 16 and 16a are formed in first and second contact holes 15 and 15a.

Then, etching is effected on TiN layers 27 and 27a and TiN layers 26 and 26a. Thereby, Ti layers 26 and 26a and TiN layers 27 and 27a are remained only in first and second contact holes 15 and 15a as shown in FIGS. 17A and 17B.

Referring to FIGS. 18A and 18B, barrier layers 29 and capacitor lower electrodes 17 are formed on first plug electrodes 16 by the same method as the first embodiment. At the same time, barrier layers **29*a* and pad layers 17*a* are formed over the top surfaces of second plug electrodes 16*a* and first interlayer insulating films 14*a*** in the peripheral circuitry.

Thereafter, the same steps as those in the first embodiment are carried out to form capacitor dielectric film 18, capacitor upper electrode 19, second interlayer insulating films 20 and **20*a*, first aluminum interconnection layers 21 and 21*a*, protective films 22 and 22*a*, and second aluminum interconnection layers 23 and 23*a*. Thereby, the DRAM of the third embodiment shown in FIGS. 13A and 13**B is completed.

According to the manufacturing method of this embodiment, barrier layers 28 and **28*a*** are added to the structure of the first embodiment. This may complicate the manufacturing steps to a certain extent. However, reliability, performance and others of the DRAM can be improved further.

Fourth Embodiment

Figures 19A, 19B:
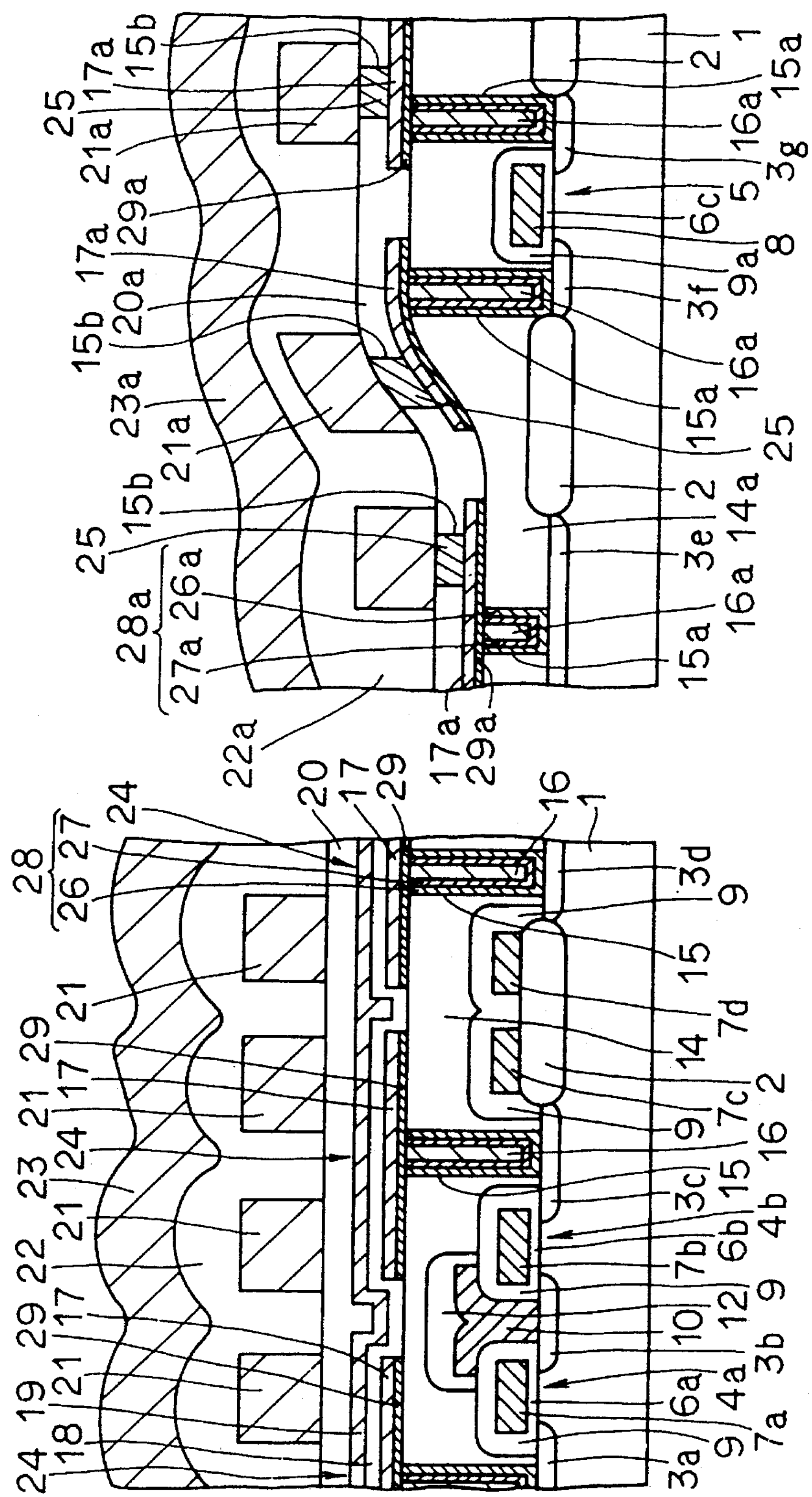
FIGS. 19A and 19B are fragmentary cross sections of a DRAM of a fourth embodiment of the invention.

Referring to FIGS. 19A and 19B to 22A and 22B, a DRAM of a fourth embodiment of the invention will be described below. FIG. 19A and 19B are fragmentary cross sections showing the DRAM of the fourth embodiment of the invention. FIGS. 20A and 20B to 22A and 22B are fragmentary cross sections showing 6th to 8th steps in a process of manufacturing the DRAM of the fourth embodiment of the invention.

Referring first to FIGS. 19A and 19B, a structure of the DRAM of the fourth embodiment of the invention will be described below. This embodiment is a modification of the third embodiment described before, and differs from the third embodiment in that third plug electrodes 25 are formed in third contact holes **15*b*. Other structure is the same as that of the third embodiment. Owing to this structure, reliability of the contacts between first aluminum interconnection layers 21*a* and pad layers 17*a*** can be improved in comparison with the third embodiment, as the second embodiment can improve the reliability in comparison with the first embodiment.

Figure 20B:
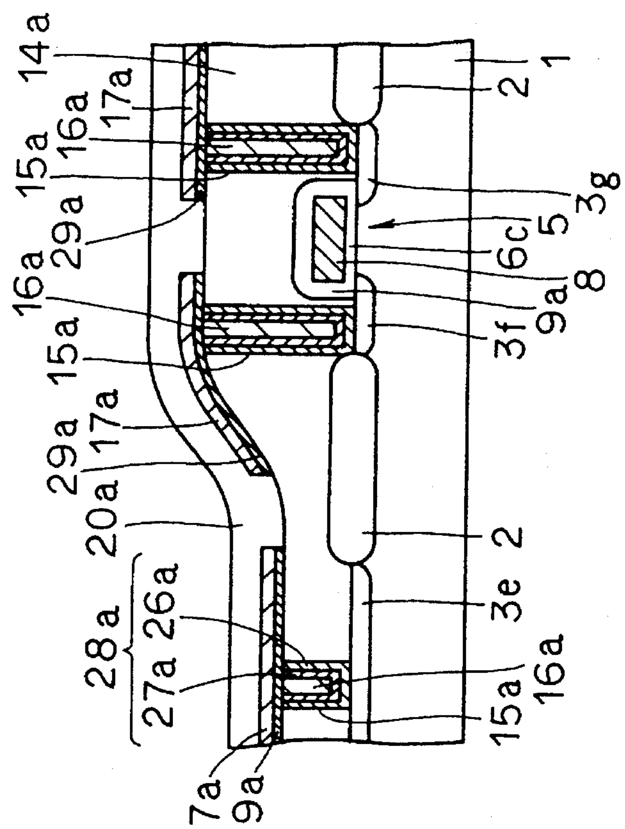
Figure 20A:
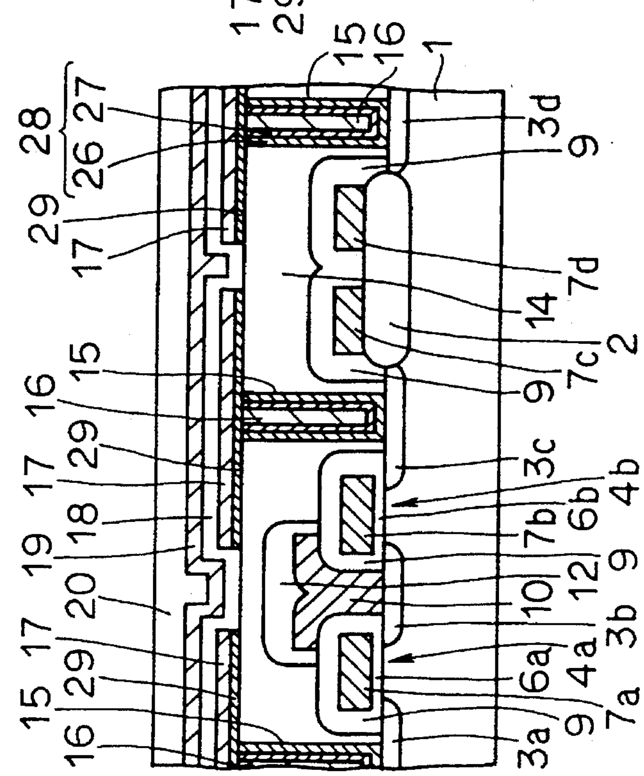

Referring to FIGS. 20A and 20B to 22A and 22B, a method of manufacturing the DRAM of the fourth embodiment of the invention will be described below. Referring to FIGS. 20A and 20B, a process from the initial step to the step of forming second interlayer insulating films 20 and **20*a*** is carried out similarly to that of the third embodiment.

Figure 21B:
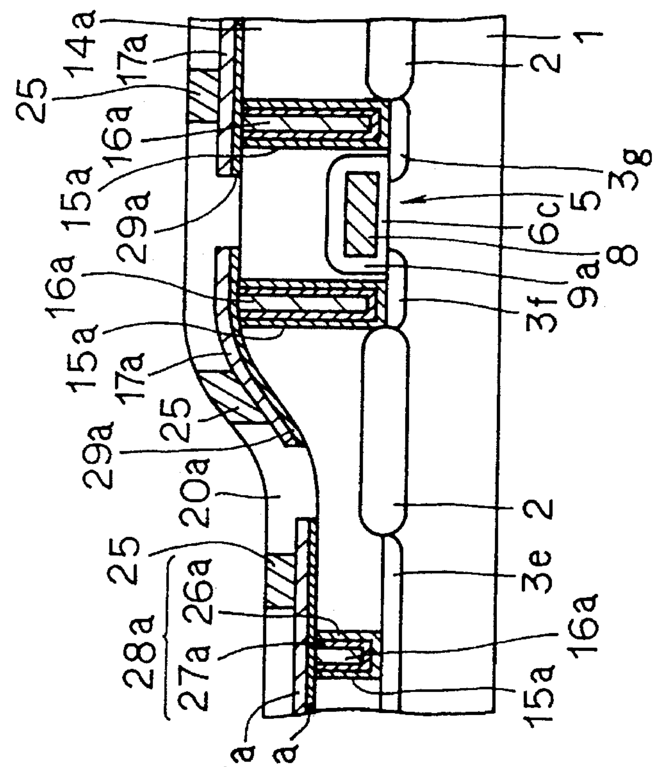
Figure 21A:
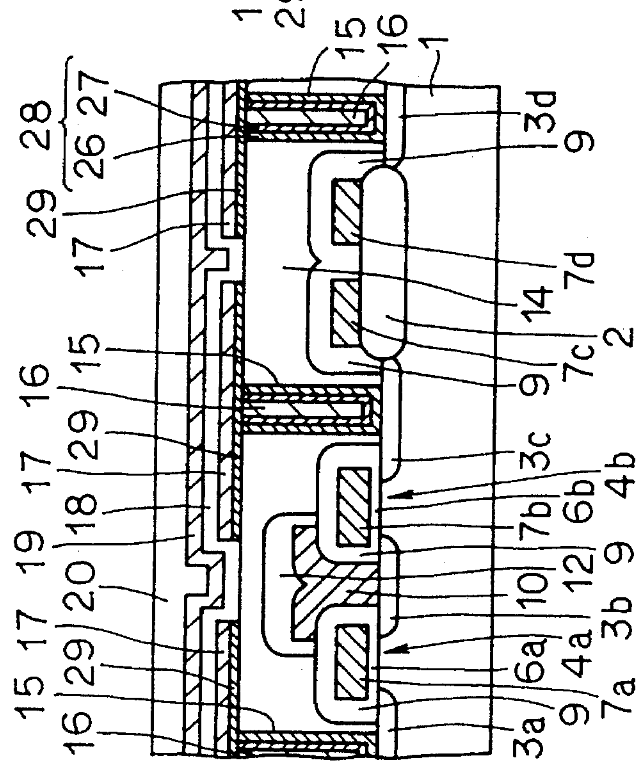

Referring to FIGS. 21A and 21B, third contact holes **15*b* are formed at second interlayer insulating film 20*a* in the peripheral circuitry by the same method as the second embodiment. Third plug electrodes 25 are formed in third contact holes 15*b*** by the same method as the second embodiment.

Figure 22B:
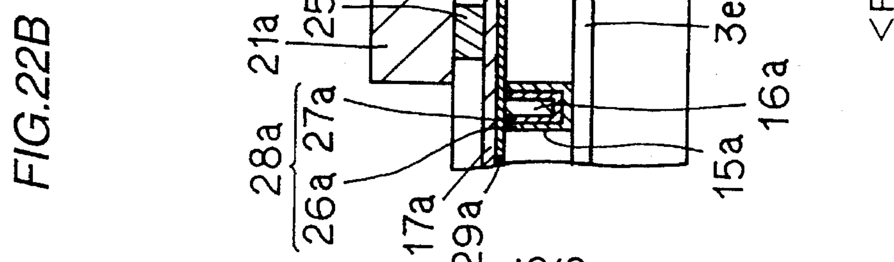
Figure 22A:
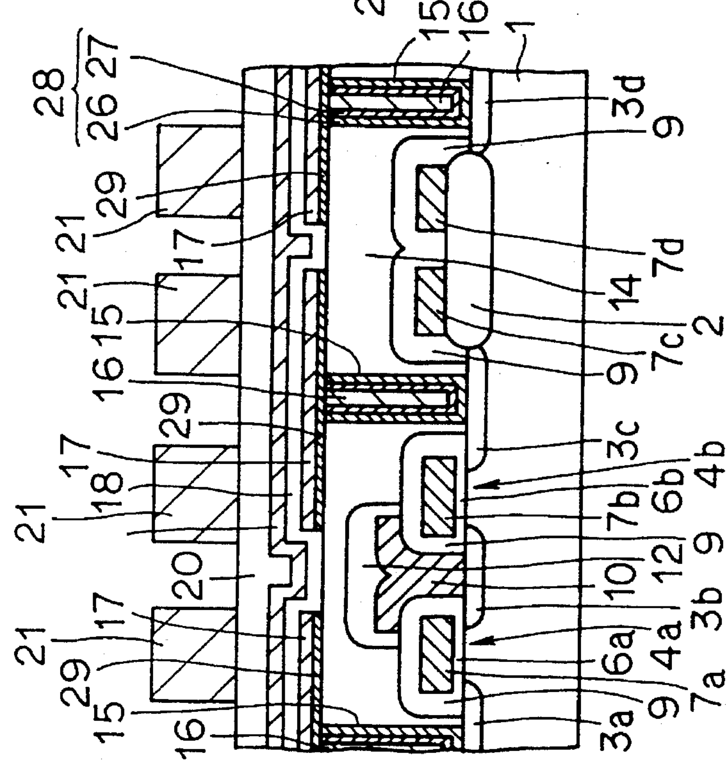

Referring to FIGS. 22A and 22B, first aluminum interconnection layers 21 are formed on second interlayer insulating film 22 in the memory cell array with a predetermined space between each other. At the same time, first aluminum interconnection layers **21*a* are formed on third plug electrodes 25** in the peripheral circuitry.

Thereafter, the same steps as those of the first embodiment are carried out to form protective films 22 and **22*a* as well as second aluminum interconnection layers 23 and 23*a*. Thereby, the DRAM of the fourth embodiment shown in FIGS. 19A and 19**B is completed.

Also in this embodiment, second and third contact holes **15*a* and 15*b* can be formed more easily than the prior art, similarly to the embodiments already described. Although formation of plug electrodes 25** increases the manufacturing cost to a certain extent, it improves the reliability.

Fifth Embodiment

Figure 23B:
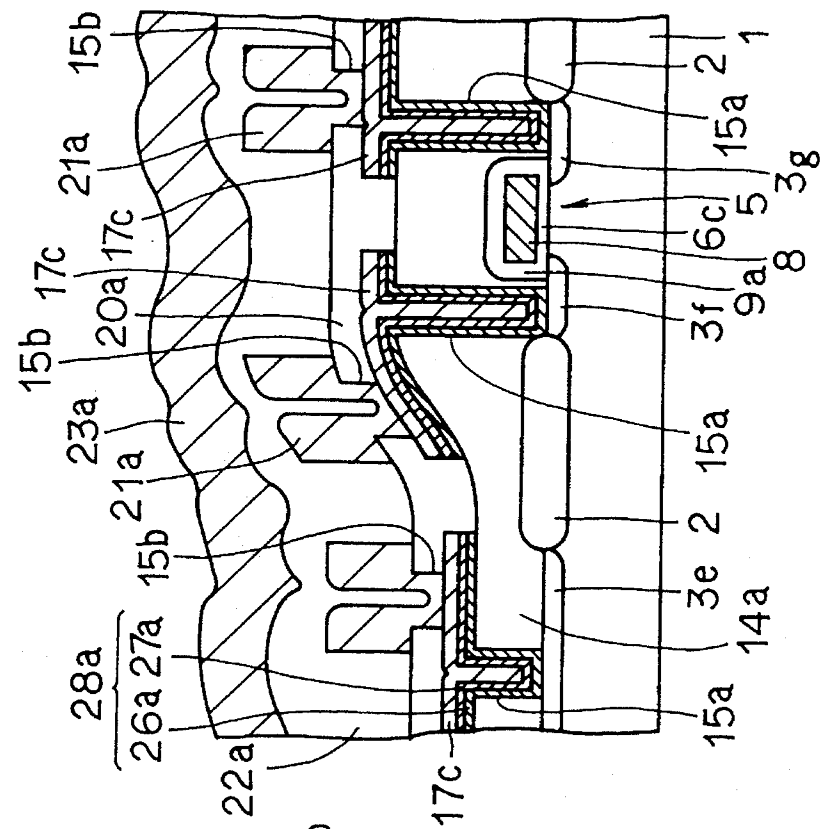
FIGS. 23A and 23B are fragmentary cross sections of a DRAM of a fifth embodiment of the invention.
Figure 23A:
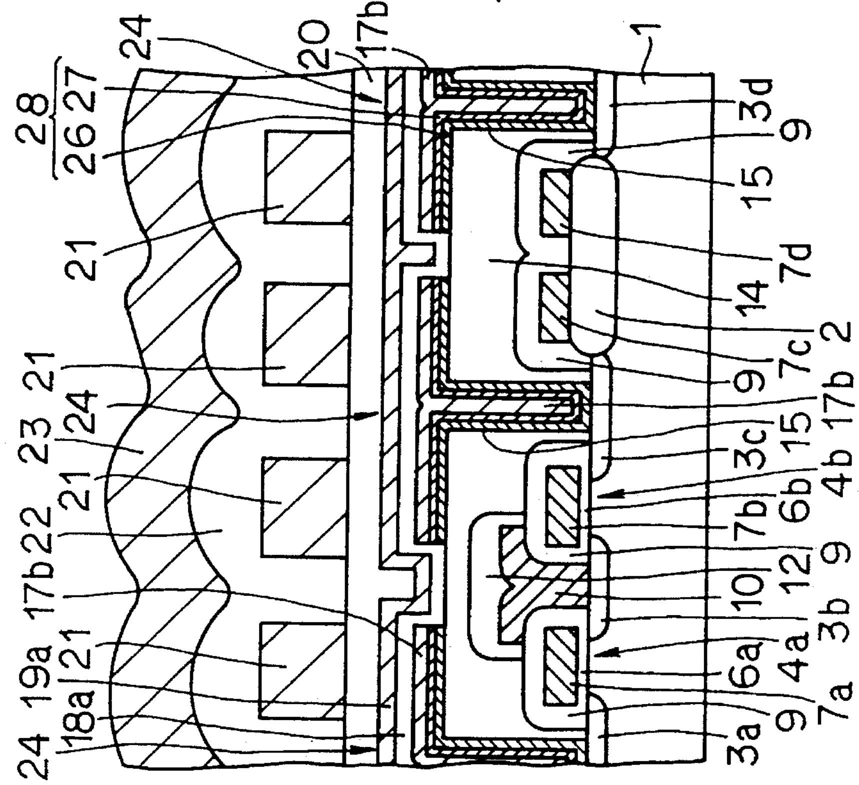

Referring to FIGS. 23A and 23B to 27A and 27B, a DRAM of a fifth embodiment of the invention will be described below. FIGS. 23A and 23B are fragmentary cross sections showing the DRAM of the fifth embodiment of the invention. FIGS. 24A and 24B to 27A and 27B are fragmentary cross sections showing 4th to 7th steps in a process of manufacturing the DRAM of the fifth embodiment of the invention.

This embodiment will be described in view of the fact that the invention is applicable to a DRAM which does not use films made of high dielectric material as the capacitor dielectric films.

Referring first to FIGS. 23A and 23B, a structure of the DRAM of the fifth embodiment of the invention will be described below. As shown in FIGS. 23A and 23B, this embodiment includes capacitor lower electrodes **17*b* each having a structure which integrally includes capacitor lower electrode 17 and plug electrode 16 in the third embodiment shown in FIG. 13**A.

Pad layers **17*c* formed in the peripheral circuitry each have a structure which integrally includes pad layer 17*a* and second plug electrode 16*a* shown in FIG. 13B. Pad layers 17*c* and capacitor lower electrodes 17*b*** may be made of polysilicon.

In this embodiment, capacitor dielectric film 18 is made of an ONO film or the like. Capacitor upper electrodes **19*a* are made of polysilicon. Other structure is the same as that of the third embodiment shown in FIGS. 13A and 13**B.

Owing to the above structures of capacitor lower electrodes **17*b* and pad layers 17*c*, the manufacturing steps can be simpler than those of the third embodiment. In the third embodiment, capacitor lower electrodes 17 and pad layers 17*a* are formed at the step different from that of forming first and second plug electrodes 16 and 16*a***. This embodiment, however, can form them at the same step. Therefore, the manufacturing steps can be simpler than those of the third embodiment.

Similarly to the embodiments already described, the embodiment can form second and third contact holes **15*a* and 15 as well as first aluminum interconnection layers 21*a*** more easily than the prior art.

Figure 24B:
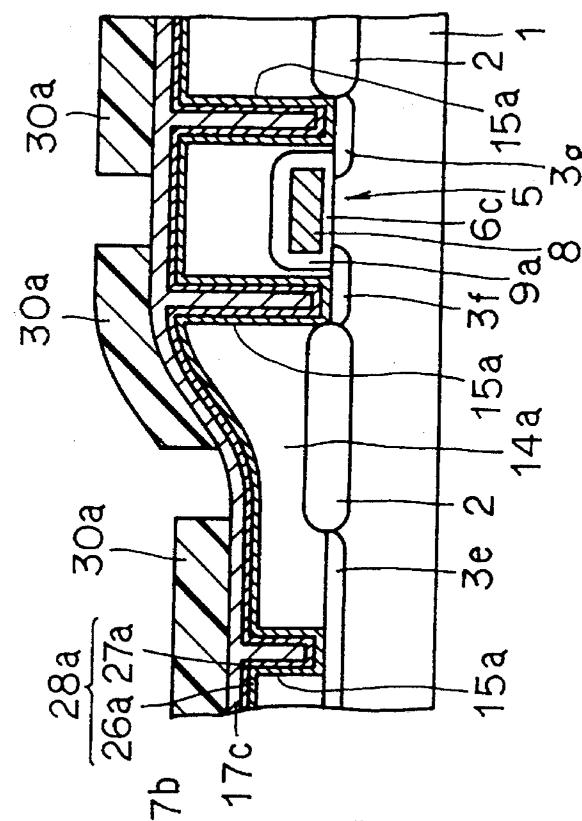
Figure 24A:
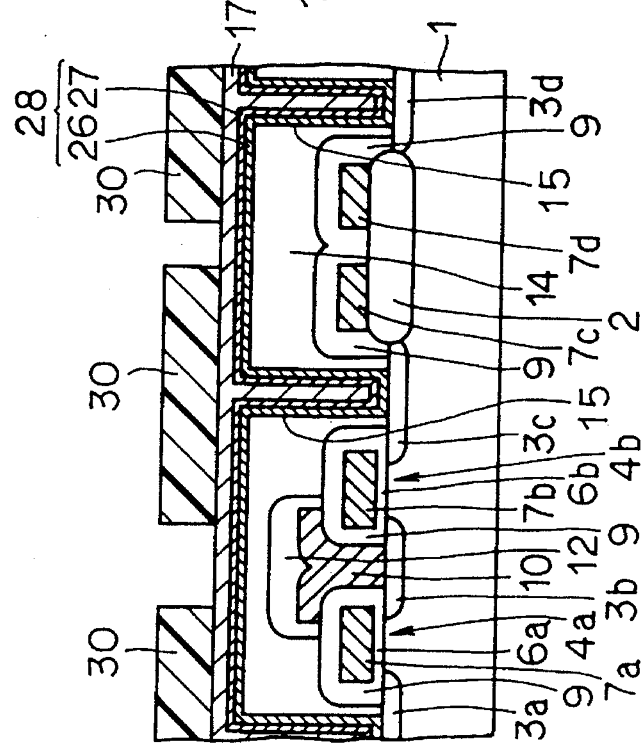

Referring to FIGS. 24A and 24B to 27A and 27B, a method of manufacturing the DRAM of the fifth embodiment of the invention will be described below. Referring to FIGS. 24A and 24B, a process from the initial step to the step of forming TiN layers 27 and **27*a* is carried out similarly to that of the third embodiment. Then, a CVD method or the like is used to form polysilicon layers 17*b* and 17*c* on TiN layers 27 and 27*a*, respectively. Resist patterns 30 and 30b which are patterned into predetermined configurations are formed on polysilicon layers 17*b* and 17*c***.

Figures 25A, 25B:
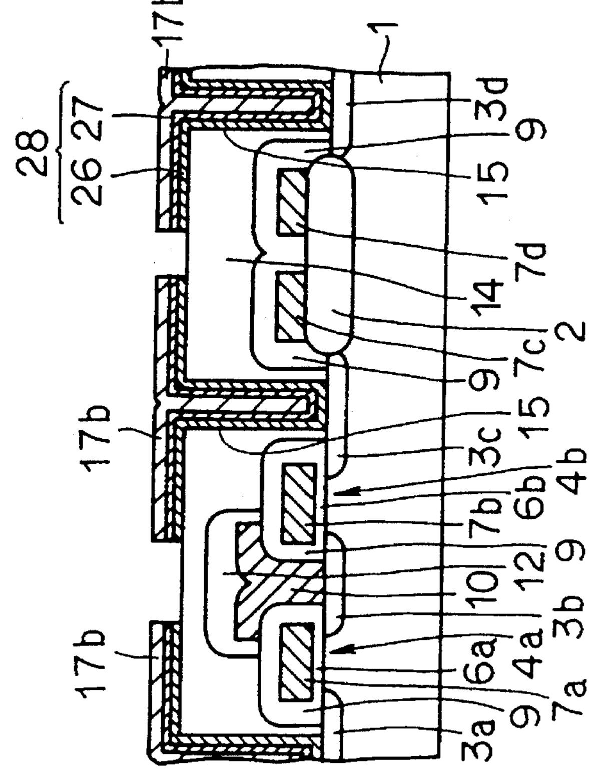

Referring to FIGS. 25A and 25B, polysilicon layers **17*b* and 17*c*, TiN layers 27 and 27*a*, and Ti layers 26 and 26*a* are sequentially etched using resist pattern 30 and 30*a* as a mask. Thereby, barrier layers 28 and 28*a*, capacitor lower electrodes 17*b* and pad layers 17*c*** are formed.

Figure 26A:
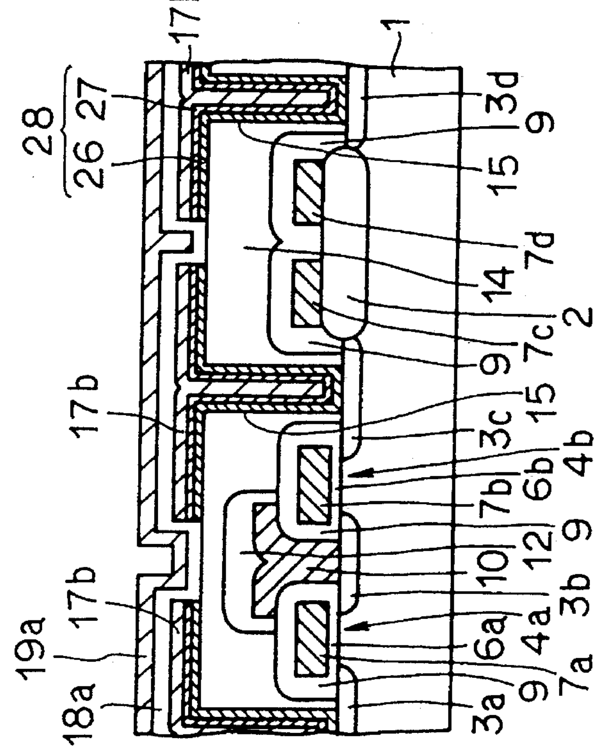
Figure 26B:
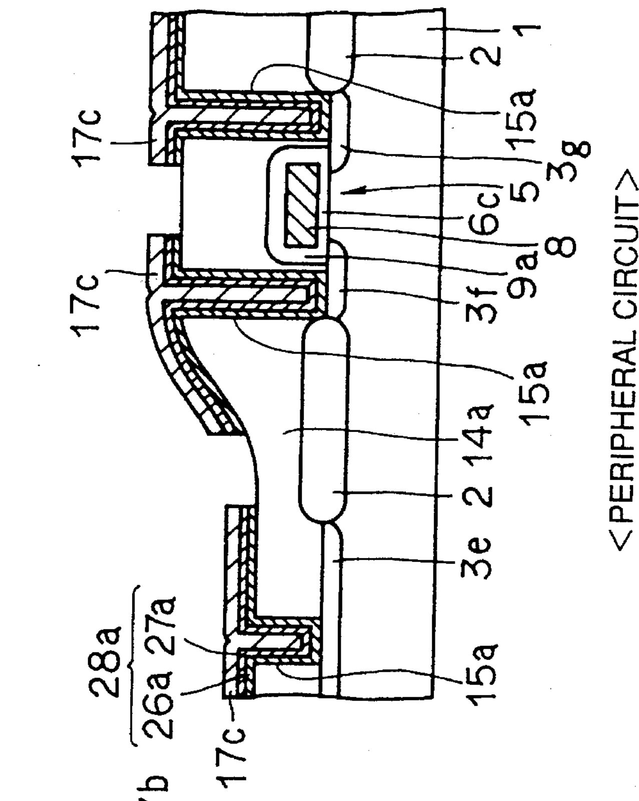

Referring to FIGS. 26A and 26B, capacitor dielectric film **18*a* made of an ONO film is formed to cover capacitor lower electrodes 17*b*. A CVD method or the like is used to form capacitor upper electrode 19*a* made of polysilicon or the like and covering capacitor dielectric film 18*a***.

Figures 27A, 27B:
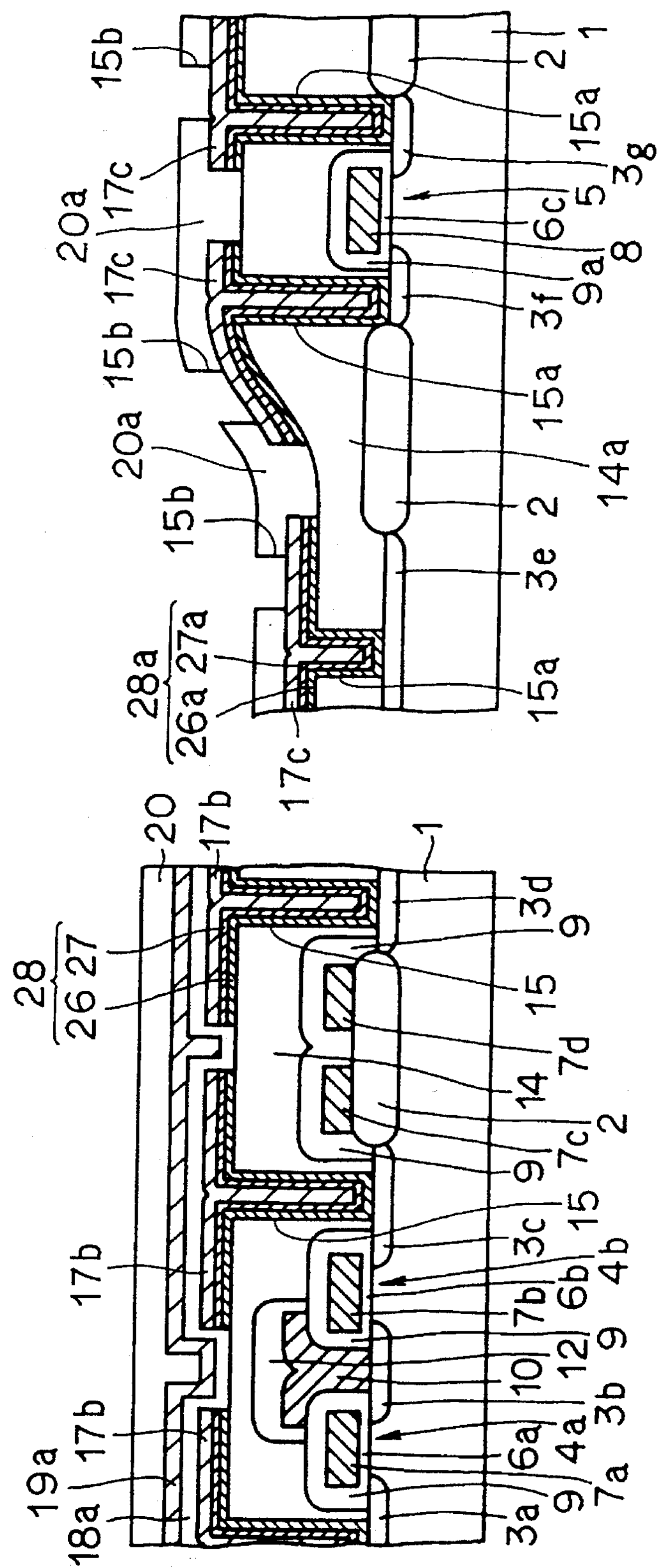
Figure 28:
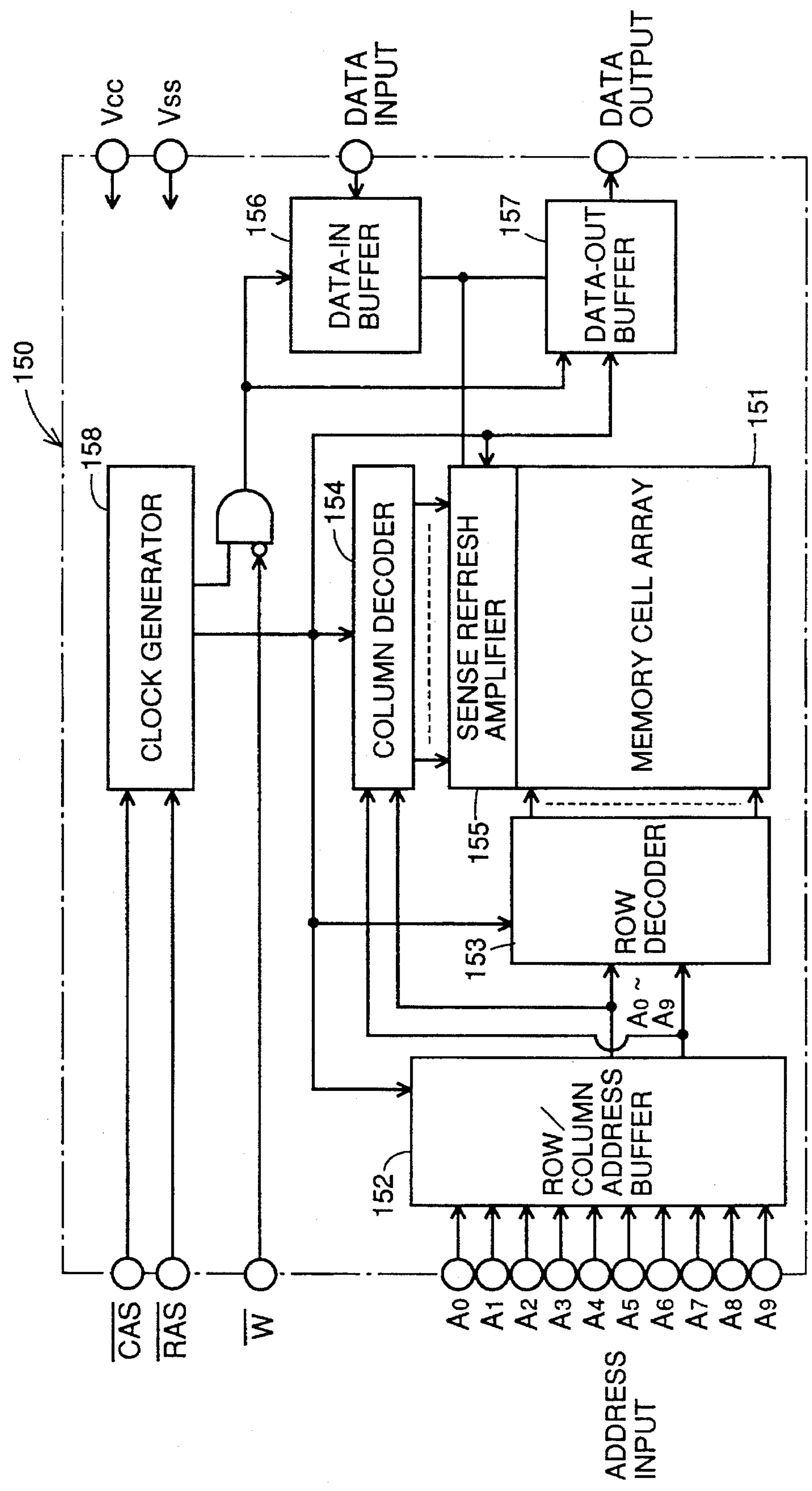
FIG. 28 is a block diagram showing a general structure of a DRAM.
Figures 29A, 29B:
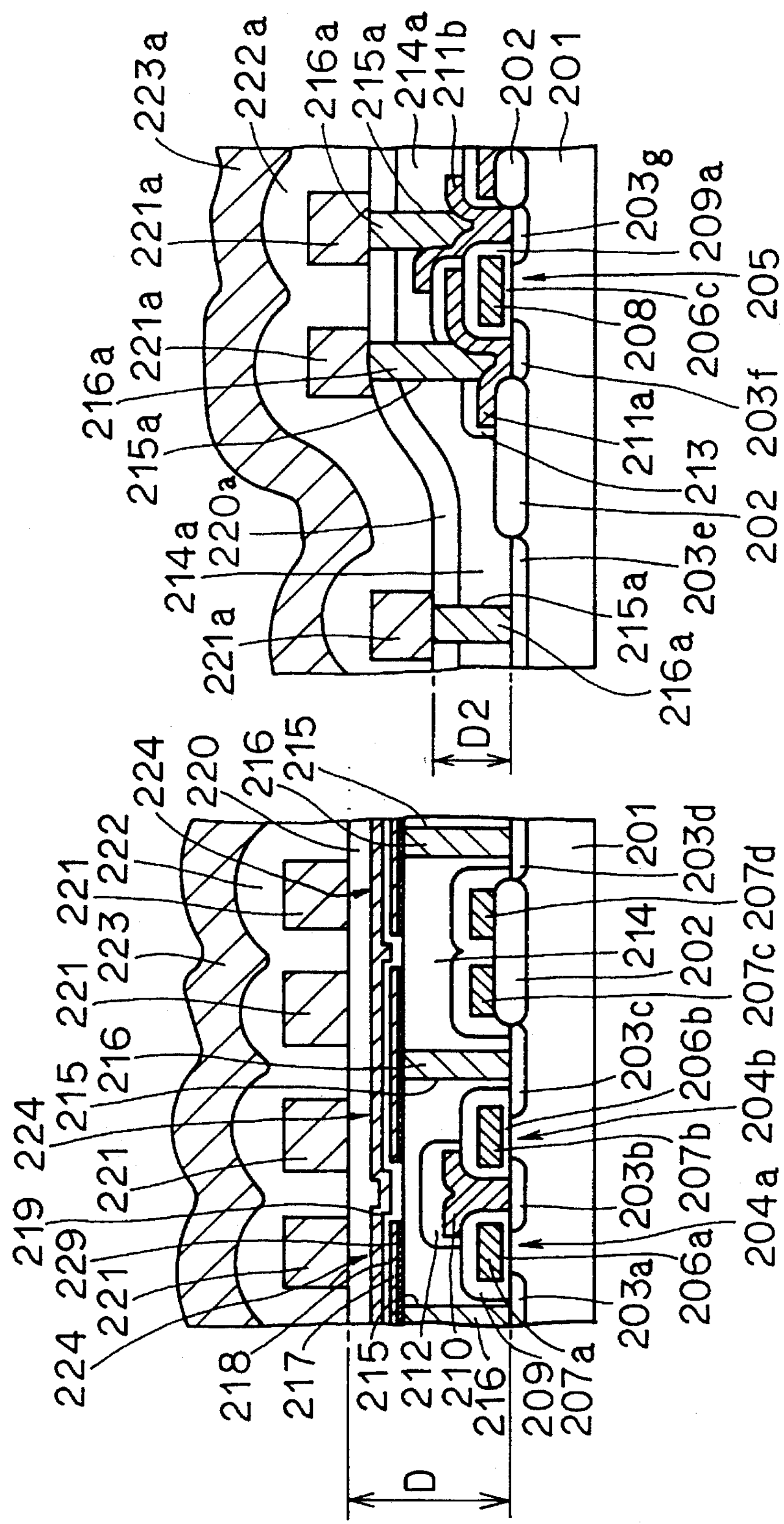
FIGS. 29A and 29B are fragmentary cross sections showing an example of a conventional DRAM.
Figure 30A:
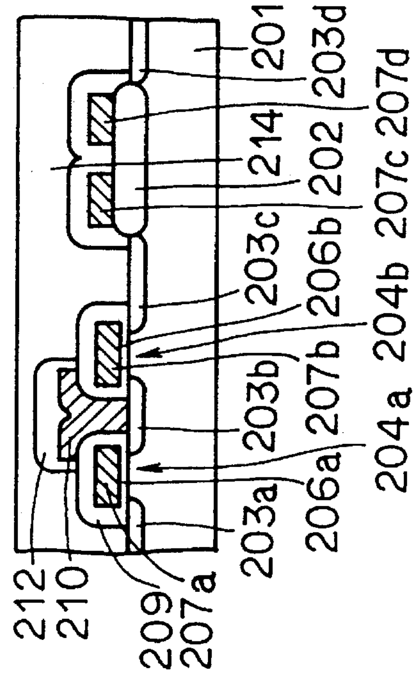
Figure 30B:
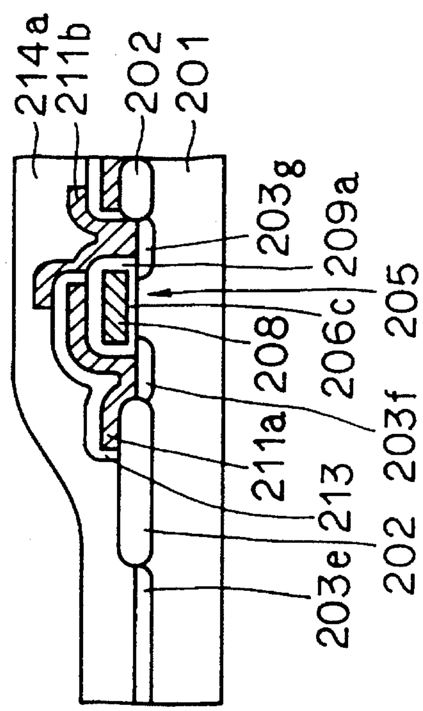
Figure 31A:
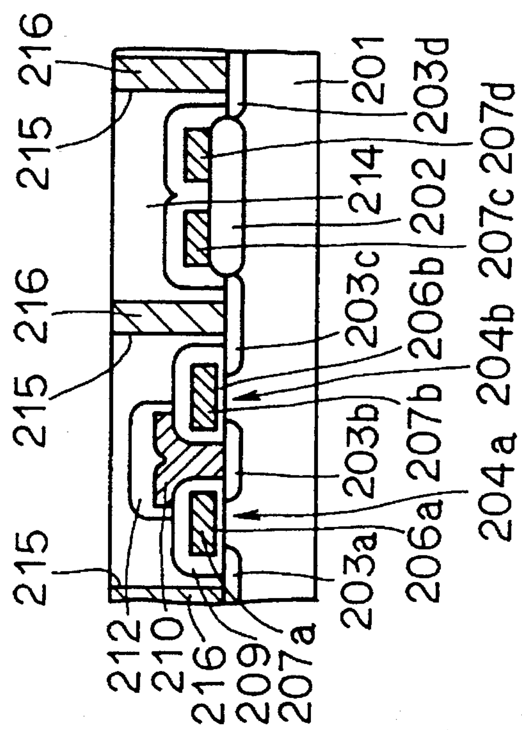
Figure 31B:
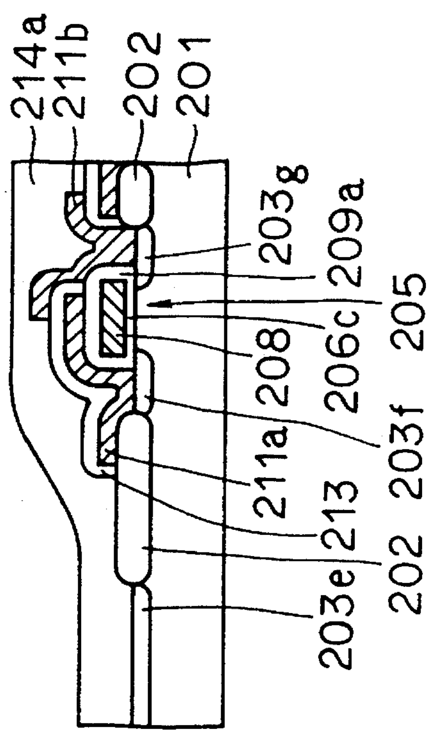
Figure 32B:
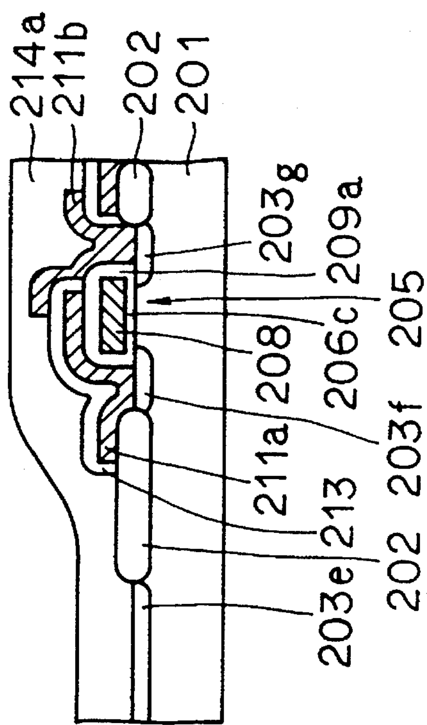
Figure 32A:
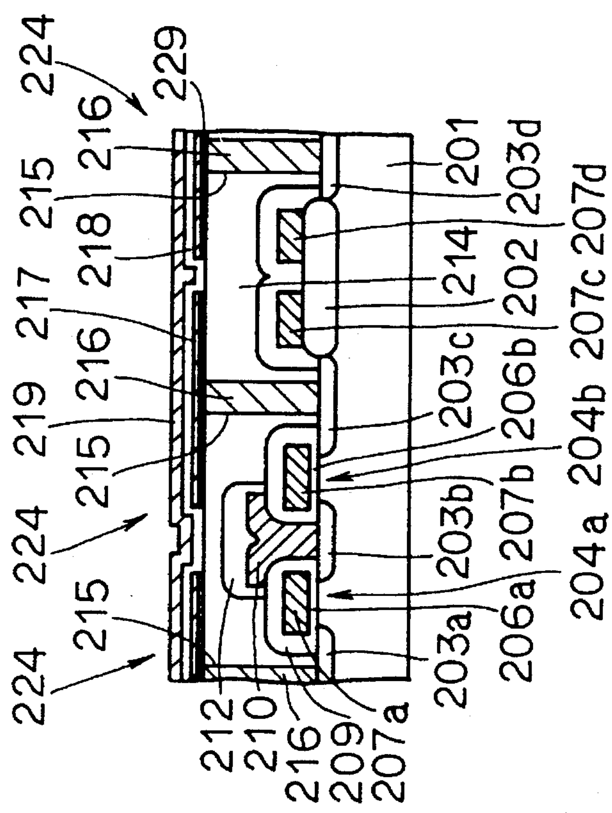
Figure 33A:
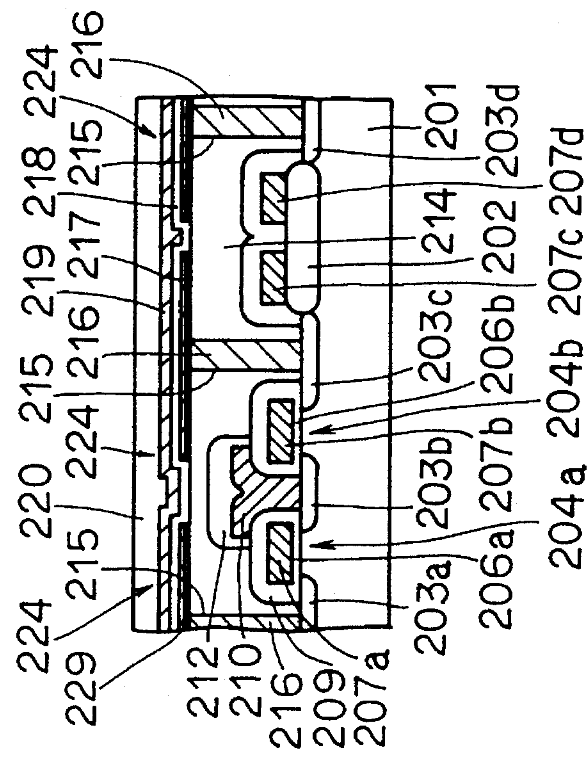
Figure 33B:
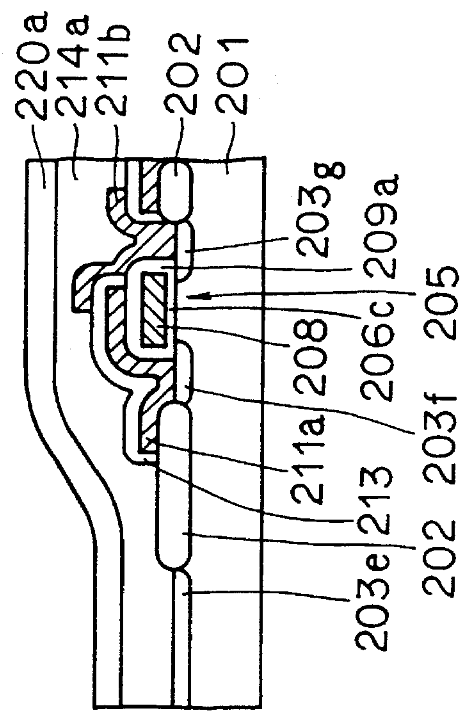
Figure 34B:
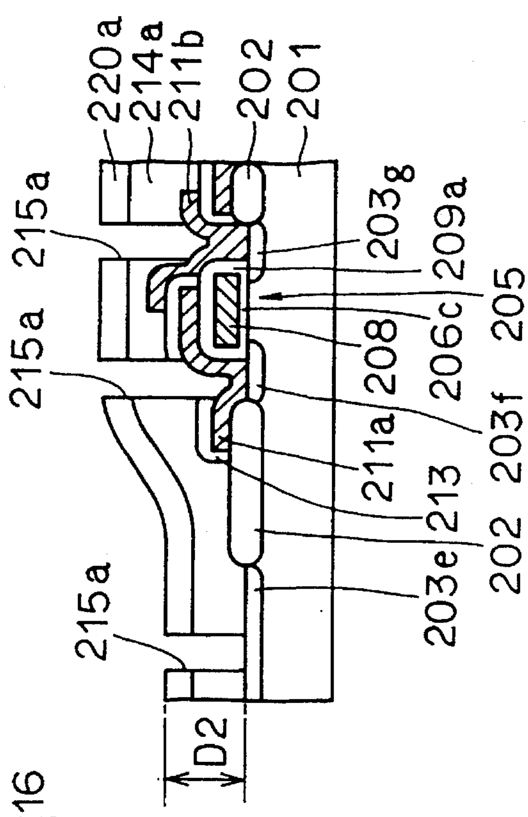
Figure 34A:
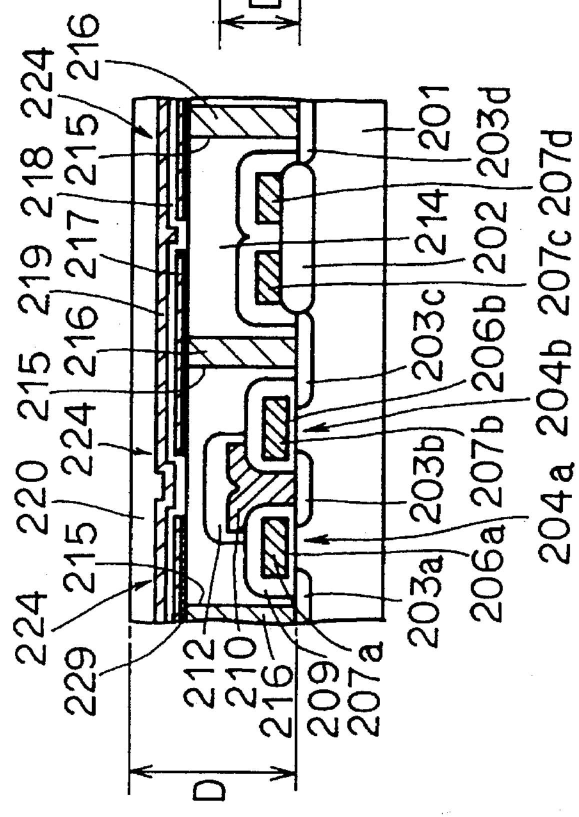
Figure 35B:
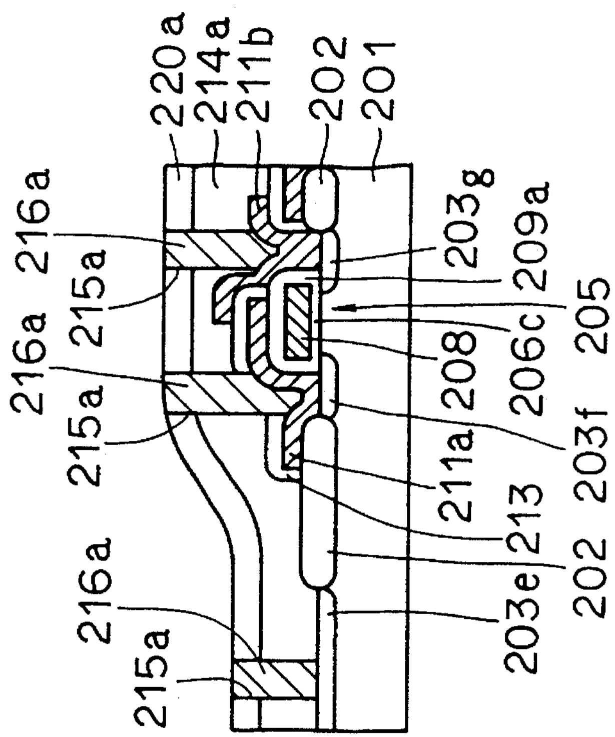
Figure 35A:
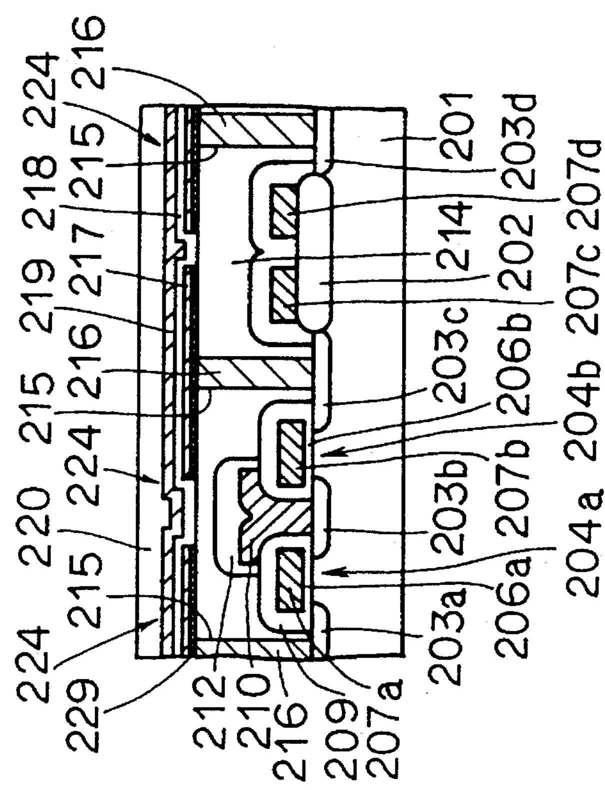
Figures 36A, 36B:
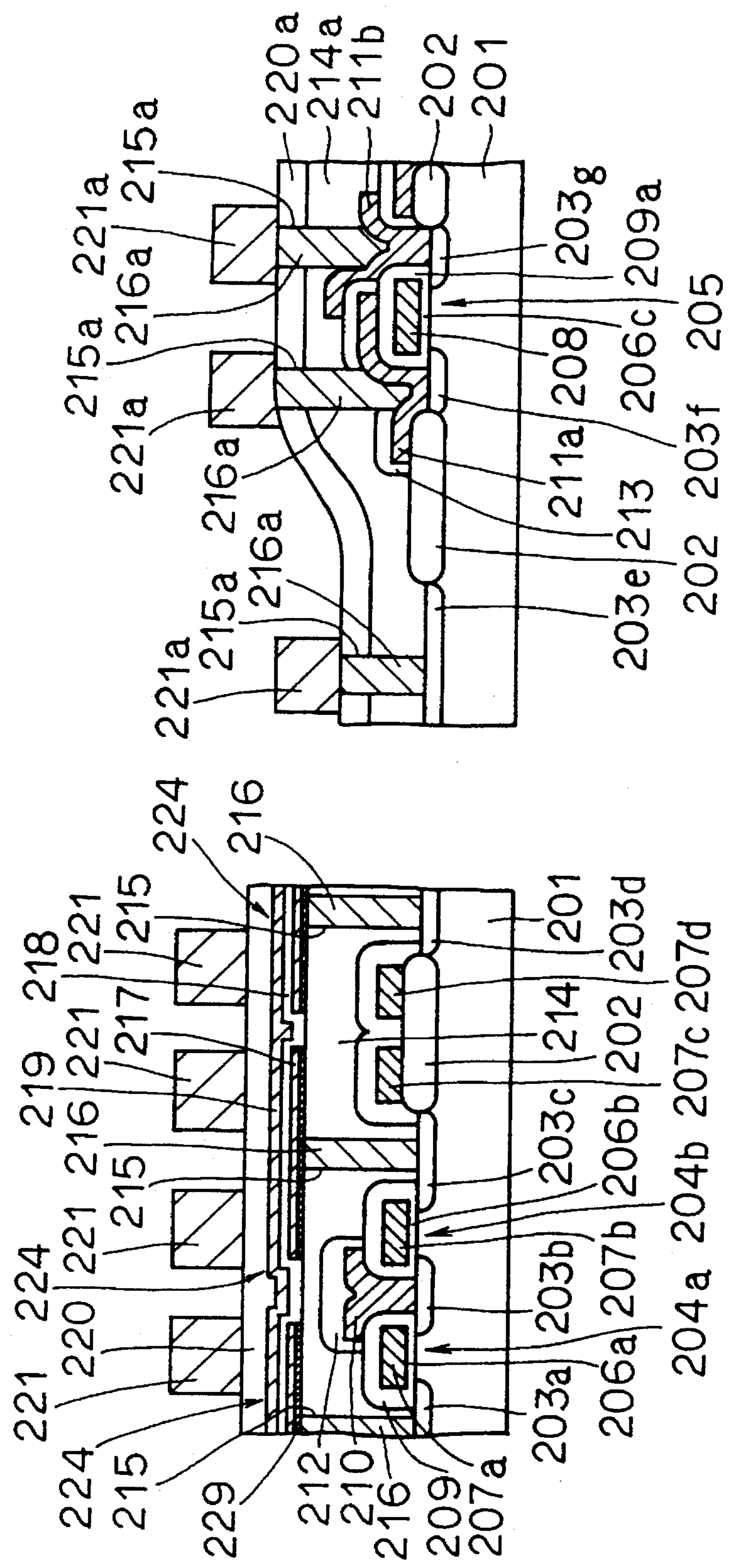

Referring to FIGS. 27A and 27B, a CVD method or the like is used to form second interlayer insulating films 20 and 20*a* made of BPSG films to cover capacitor upper electrode 19*a* and pad layers 17*c*. Third contact holes 15*b* are formed at portions of second interlayer insulating film 20*a* located above pad layers 17*c* in the peripheral circuitry.

Thereafter, the same steps as those of the third embodiment are carried out to form first aluminum interconnection layers 21 and 21*a*, protective films 22 and 22*a* and second aluminum interconnection layers 23 and 23*a*. Thereby, the DRAM of the fifth embodiment shown in FIGS. 23A and 23B is completed. In the embodiments described before, the interlayer insulating films (14 and 20) formed in the memory cell array are made of the same material as the interlayer insulating films (14*a* and 20*a*) formed in the peripheral circuitry. However, different materials may be used.

According to the semiconductor memory device of the invention, as described hereinbefore, it is not necessary to form openings (contact holes) of a large aspect ratio in the peripheral circuitry, as is done in the prior art. Therefore, the openings can be formed easily in the peripheral circuitry. The pad layer is formed in the peripheral circuitry for making contact between the main surface of the semiconductor substrate and the interconnection layer. The pad layer may be extended over the top surface of the first interlayer insulating film, which increases the degree of freedom relating to the position of the third opening. Thereby, the third opening and interconnection layer can be formed easily even if the degree of integration further increases.

The pad layer and capacitor lower electrode may be made of the same material, in which case the pad layer and capacitor lower electrode can be formed at the same step, simplifying the manufacturing process. Thereby, the manufacturing cost can be reduced. The first plug electrode and capacitor lower electrode may be integral with each other, and the second plug electrode and pad layer may be integral with each other, in which case the manufacturing process can be simplified further. Thereby, the manufacturing cost can be further reduced.

Metal of a high melting point such as platinum may be selected as the material of the pad layer, in which case good contact can be made between the interconnection layer and pad layer, and the third contact hole 15*b* can be formed easily.

According to the method of manufacturing the semiconductor memory device of one aspect of the invention, the pad layer formed at the same step as the capacitor lower electrode is remained. Thereby, the second and third openings formed in the peripheral circuitry can be shallower than the openings in the peripheral circuitry of the prior art. Thereby, the second and third openings can be formed easily. The pad layer can be formed of have a top surface or a bottom surface of a relatively large area. Thereby, it is possible to increase the degree of freedom of the position at which the third opening is formed. Therefore, the third opening can be formed easily.

Further, it is possible to eliminate a conventional step of forming a plug for electrically connecting the interconnection layer to the main surface of the semiconductor substrate in the peripheral circuitry. Thereby, the manufacturing steps can be simpler than those of the prior art, and thus the manufacturing cost can be reduced.

According to the method of manufacturing the semiconductor memory device of another aspect of the invention, the capacitor lower electrode is integral with the first plug electrode, and the pad layer is integral with the second plug electrode. Thereby, the capacitor lower electrode and first plug electrode can be formed at the same step, and the pad layer and second plug electrode can be formed at the same step. Therefore, the manufacturing steps can be further simplified. Consequently, the manufacturing cost can be further reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a memory cell portion and a peripheral circuit portion on a main surface of a semiconductor substrate, said memory cell portion including memory cells for storing information and said peripheral circuit portion including peripheral circuits for controlling an operation of said memory cells, said semiconductor memory device, comprising;

a first interlayer insulating film which is provided with a first opening at a predetermined position in said memory cell portion of said semiconductor substrate and a second opening at a predetermined position in said peripheral circuit portion of said semiconductor substrate;

first and second plug electrodes formed in said first and second openings, respectively;

a capacitor lower electrode formed on and electrically connected to said first plug electrode;

a capacitor dielectric film covering said capacitor lower electrode;

a capacitor upper electrode covering said capacitor dielectric film;

a pad layer formed on a top surface of said second plug electrode and a top surface of said first interlayer insulating film and electrically connected to said second plug electrode;

a second interlayer insulating film formed on said pad layer and having a third opening located above said pad layer; and an interconnection layer formed at least in said third opening and electrically connected to said pad layer.

2. A semiconductor memory device according to claim 1, wherein said pad layer and said capacitor lower electrode are made of the same material.

3. A semiconductor memory device according to claim 1, wherein said capacitor lower electrode and said first plug electrode are integral with each other, and said pad layer and said second plug electrode are integral with each other.

4. A semiconductor memory device according to claim 1, wherein said pad layer and said capacitor lower electrode are made of noble metal having a high melting point.

5. A semiconductor memory device according to claim 4, wherein said capacitor lower electrode and said pad layer are made of at least one material selected from the group consisting of Pt and Pd.

6. A semiconductor memory device according to claim 1, wherein said capacitor dielectric film is made of material having a high dielectric constant.

7. A semiconductor memory device according to claim 1, wherein said pad layer further comprises a first layer formed on a top surface of said second plug electrode and a second layer formed on top of said first layer, wherein said first layer is formed of a material which is nonreactive with a material of said second plug electrode.

8. A semiconductor memory device according to claim 1, wherein said capacitor lower electrode further comprises a first layer formed on top surface of said first plug electrode and a second layer formed on top of said first layer, wherein said first layer is formed of a material which is non-reactive with a material of said first plug electrode and said second layer forms a substrate for said dielectric material.

9. A semiconductor memory device according to claim 1, wherein each of said first and second plug electrodes comprise polysilicon selectively ion-implanted with an impurity type corresponding to that portion of the semiconductor substrate underlying a corresponding one of said first and second plug electrodes.

10. A semiconductor memory device according to claim 1, wherein said third opening is formed on said pad layer positioned on said top surface of said first interlayer insulating film.

* * * * *